United States Patent
Phillips et al.

(10) Patent No.: US 6,241,858 B1
(45) Date of Patent: Jun. 5, 2001

(54) METHODS AND APPARATUS FOR PRODUCING ENHANCED INTERFERENCE PIGMENTS

(75) Inventors: Roger W. Phillips; Vladimir Raksha, both of Santa Rosa, CA (US)

(73) Assignee: Flex Products, Inc., Santa Rosa, CA (US)

( * ) Notice: Subject to any disclaimer, the term of this patent is extended or adjusted under 35 U.S.C. 154(b) by 0 days.

(21) Appl. No.: 09/389,962

(22) Filed: Sep. 3, 1999

(51) Int. Cl.$^7$ .................................................. C09C 1/00
(52) U.S. Cl. .................... 204/192.15; 427/576; 427/580; 427/570; 427/571; 427/596; 427/597; 118/716; 118/719; 118/723 VE; 118/723 EB; 118/723 E; 118/729; 428/363; 428/402; 428/403; 428/404; 428/406
(58) Field of Search ........................... 204/192.1, 192.11, 204/192.12, 298.26, 192.13, 298.27, 192.15, 192.17, 192.16, 192.22, 192.26, 192.27, 192.28, 298.02, 298.04, 298.13, 298.15, 298.19, 298.23, 298.28, 298.29; 118/716, 719, 723 VE, 723 EB, 723 E, 729; 106/403, 404, 415, 416, 417, 425, 436, 450, 456, 457, 469, 481, 482, 489, 418; 427/569, 576, 580, 570, 571, 596, 597; 428/363, 402, 403, 404, 406

(56) References Cited

U.S. PATENT DOCUMENTS

| | | |
|---|---|---|
| 3,011,383 | 12/1961 | Sylvester et al. . |
| 3,123,490 | 3/1964 | Bolomey et al. . |
| 3,412,575 | 11/1968 | Feldman et al. . |
| 3,622,473 | 11/1971 | Ohta et al. . |
| 3,926,659 | 12/1975 | Bernhard et al. . |
| 3,949,139 | 4/1976 | Dunning et al. . |
| 3,962,397 | 6/1976 | Narui et al. . |

(List continued on next page.)

FOREIGN PATENT DOCUMENTS

| | | |
|---|---|---|
| 353544 | * 7/1989 | (EP) . |
| 0 351 932 A1 | 1/1990 | (EP) . |
| 353544 | 7/1990 | (EP) . |
| 0 484 108 A1 | 5/1992 | (EP) . |
| 0 972 749 A1 | 7/1999 | (EP) . |
| 56-130469 | * 10/1981 | (JP) . |
| 1-147065 | * 6/1989 | (JP) . |
| 10158541 | 6/1998 | (JP) . |
| WO 96/22336 | 7/1996 | (WO) . |
| WO 96/38505 | 12/1996 | (WO) . |
| WO 99/35194 | 7/1999 | (WO) . |

OTHER PUBLICATIONS

Dobrowolski et al., Optical Interference Coatings for Inhibiting of Counterfeiting, *Optica ACTA*, vol. 20, No. 12, pp. 925–937, 1973. (Month Unknown).

(List continued on next page.)

*Primary Examiner*—Alan Diamond
(74) *Attorney, Agent, or Firm*—Workman, Nydegger & Seeley

(57) ABSTRACT

Methods and apparatus are provided for uniformly depositing a coating material from a vaporization source onto a powdered substrate material to form a thin coalescence film of the coating material that smoothly replicates the surface microstructure of the substrate material. The coating material is uniformly deposited on the substrate material to form optical interference pigment particles. The thin film enhances the hiding power and color gamut of the substrate material. Physical vapor deposition processes are used for depositing the film on the substrate material. The apparatus and systems employed in forming the coated particles utilize vibrating bed coaters, vibrating conveyor coaters, or coating towers. These allow the powdered substrate material to be uniformly exposed to the coating material vapor during the coating process.

63 Claims, 16 Drawing Sheets

U.S. PATENT DOCUMENTS

| | | |
|---|---|---|
| 3,988,494 | 10/1976 | McAdow . |
| 4,116,710 | 9/1978 | Heikel . |
| 4,168,983 | 9/1979 | Vittands et al. . |
| 4,213,886 | 7/1980 | Tumer . |
| 4,309,075 | 1/1982 | Apfel et al. . |
| 4,321,087 | 3/1982 | Levine et al. . |
| 4,434,010 | 2/1984 | Ash .................................... 106/291 |
| 4,552,593 | 11/1985 | Ostertag . |
| 4,606,941 | 8/1986 | Jenkin ................................ 427/217 |
| 4,629,512 | 12/1986 | Kondis . |
| 4,705,300 | 11/1987 | Berning et al. . |
| 4,705,356 | 11/1987 | Berning et al. . |
| 4,721,217 | 1/1988 | Phillips et al. . |
| 4,756,771 | 7/1988 | Brodalla et al. . |
| 4,851,095 | 7/1989 | Scobey et al. ................... 204/192.12 |
| 4,940,523 * | 7/1990 | Takeshima ...................... 204/192.12 |
| 4,978,394 | 12/1990 | Ostertag et al. . |
| 5,009,486 | 4/1991 | Dobrowolski et al. . |
| 5,059,245 | 10/1991 | Phillips et al. . |
| 5,084,351 | 1/1992 | Phillips et al. . |
| 5,116,664 | 5/1992 | Kimura et al. ...................... 428/216 |
| 5,135,812 | 8/1992 | Phillips et al. . |
| 5,171,363 | 12/1992 | Phillips et al. . |
| 5,190,807 | 3/1993 | Kimock et al. . |
| 5,198,042 | 3/1993 | Masumoto et al. . |
| 5,225,057 | 7/1993 | LeFebvre et al. .............. 204/192.13 |
| 5,278,590 | 1/1994 | Phillips et al. . |
| 5,279,657 | 1/1994 | Phillips et al. . |
| 5,332,767 | 7/1994 | Reisser et al. . |
| 5,356,471 | 10/1994 | Reynders . |
| 5,364,467 | 11/1994 | Schmid et al. . |
| 5,378,527 | 1/1995 | Nakanishi et al. . |
| 5,549,774 | 8/1996 | Miekka et al. . |
| 5,571,624 | 11/1996 | Phillips et al. ....................... 428/403 |
| 5,573,584 | 11/1996 | Ostertag et al. ..................... 106/417 |
| 5,587,207 * | 12/1996 | Gorokhovsky ...................... 427/571 |
| 5,593,773 | 1/1997 | McKay et al. . |
| 5,607,504 | 3/1997 | Schmid et al. . |
| 5,624,076 | 4/1997 | Miekka et al. . |
| 5,624,486 | 4/1997 | Schmid et al. . |
| 5,629,068 | 5/1997 | Miekka et al. . |
| 5,648,165 | 7/1997 | Phillips et al. . |
| 5,672,410 | 9/1997 | Miekka et al. . |
| 5,763,086 | 6/1998 | Schmid et al. . |
| 5,766,334 | 6/1998 | Hashizume et al. . |
| 5,766,335 | 6/1998 | Bujard et al. . |
| 5,790,304 | 8/1998 | Sanders et al. ...................... 359/361 |
| 5,830,567 | 11/1998 | Panush ................................ 428/324 |
| 5,858,078 | 1/1999 | Andes et al. . |
| 5,877,895 | 3/1999 | Shaw et al. . |
| 6,013,370 | 1/2000 | Coulter et al. ....................... 428/403 |

OTHER PUBLICATIONS

Barrett and Nix, The Principles of Engineering Materials, Prentice–Hall., 282–290, 1973. (Month Unknown).

Callister WD, Jr., Materials Science and Engineering: An Introduction, John Wiley & Sons, Inc., 91–112, 1985. (Month UnKnown).

Zink et al., Optical Probes and Properties of Aluminosilicate Glasses Prepared by the Sol–Gel Method, *Polymer Material Science and Engineering*, 61, 204–208, 1989. (Month Unknown).

McKiernan et al., Luminescence and Laser Action of Coumarin Dyes Doped in Silicate and Aluminosilicate Glasses Prepared by the Sol–Gel Technique, *Journal of Inorganic Organometallic Polymers*, vol. 1, No. 1, 87–103, 1991. (Month Unknown).

Greiwe K., Coloured Aluminum Pigments, Eckart–Werke, Werk Güntersthal, 4th Nürnberg Congress, Paper 6, 1–7. (Date Unknown).

Minolta Manual for Precise Color Communication: Color Control From Feeling to Instrumentation, pp. 18, 20, 22, 23, 46, 47, 48 and 49. (Date Unknown).

The R.D. Mathis Compnay Manual for *Thin Film Evaporation Source Reference*, (Date Unknown).

The Mearl Corporation brochure for Mearl Iridescent Film, Peekskill, New York. (Date Unknown).

R. Herrmann and G. Braäuer, "DC and RF–Magnetron Sputtering" and J. Becker, "Ion Beam Sputtering," Handbook of Optical Properties, vol. 1, pp. 135–212, R.E. Hummel and K.H. Guenter (eds.), CRC Press (1995) (Month Unknown).

D.G. Teer, "Reactive Magnetron Sputter Barrel Ion Plating," Conference Proceedings IPAT 91, p. 303–308, Brussels, Belgium (1991) (Month Unknown).

B. Window and N. Savvides, "Charged Particle Fluxes From Planar Magnetron Sputtering Sources," J. Vac. Sci. Technol. A 4(2), Mar./Apr. 1986, p. 196–202.

N. Savvides and B. Window, "Unbalanced Magnetron Ion-–Assisted Deposition and Property Modification of Thin Films," J. Vac. Sci. Technol. A 4(3), May/Jun. 1986, p. 504–508.

B. Window, F. Sharples, and N. Savvides, "Magnetically Confined Sputter Source with High Ion Flux," J. Vac. Sci. Technol. A 3(6), Nov./Dec. 1985, p. 2368–2372.

N.A.G. Ahmed and D.G. Teer, "A Simple and Inexpensive Rotating Barrel to Ion Plate Small Components," J. Phys. E:Sci. Instrum., vol. 17, 1984, p. 411–416 (Month Unknown).

Myong Ryeong Kim, "Magnetron Sputter Deposited CoPtCr Magnetic Thin Films for Information Storage," Ph.D. Dissertation Thesis, Department of Metallurgical Engineering, The University of Utah, Jun. 1993.

Flex Products Technical Bulletin No. TB–02–98, "Dynamic Color Area Diagram and Value," 1998 (Month Unknown).

Chemical Engineers' Handbook, Chemical Engineering Series, McGraw–Hill Book Company, Inc., Second Edition, 1941, pp. 2116–2123 (Month Unknown).

Patent Abstract of Japan, abstract for JP 10–158541, Jun. 1998.

* cited by examiner

METHODS AND APPARATUS FOR PRODUCING ENHANCED INTERFERENCE PIGMENTS

BACKGROUND OF THE INVENTION

1. The Field of the Invention

The present invention is related generally to thin film optical coatings for producing interference pigments. More specifically, the present invention is related to methods, systems and apparatus for producing thin interference coatings in the form of thin coalescence films which exhibit enhanced colorant or pigment effects and enhanced hiding power.

2. The Relevant Technology

Interference pigments and colorants have been used to provide a colored gloss in substances such as cosmetics, inks, coating materials, ornaments and ceramics. Typically, a silicatic material such as mica, talc or glass is coated with a material of high refractive index, such as a metal oxide, and a layer of metal particles is further deposited on top of such highly refractive material. Depending on the type and the content of the highly refractive material, different types of gloss and refractive colors are produced.

Thin film flakes having a preselected single color have been previously produced. For example, U.S. Pat. No. 4,434,010 discloses flakes composed of symmetrical layers that may be used in applications such as automotive paints and the like. The flakes are formed by depositing a semi-opaque metal layer upon a flexible web, followed by a dielectric layer, a metal reflecting layer, another dielectric layer, and finally another semi-opaque metal layer. The thin film layers are specifically ordered in a symmetric fashion such that the same intended color is achieved regardless of whether the flakes have one or the other lateral face directed towards the incident radiation.

High chroma interference platelets for use in paints, including color shifting and nonshifting single color platelets, are disclosed in U.S. Pat. No. 5,571,624. These platelets are formed from a symmetrical multilayer thin film structure in which a first semi-opaque layer such as chromium is formed on a substrate, with a first dielectric layer formed on the first semi-opaque layer. An opaque reflecting metal layer such as aluminum is formed on the first dielectric layer, followed by a second dielectric layer of the same material and thickness as the first dielectric layer. A second semi-opaque layer of the same material and thickness as the first semi-opaque layer is formed on the second dielectric layer. For the color shifting designs, the dielectric materials utilized, such as magnesium fluoride, have an index of refraction less than 2.0. For small shifting or nonshifting designs, the dielectric materials typically have an index of refraction greater than 2.0.

U.S. Pat. No. 5,116,664 discloses a pigment that is made by coating a first layer of $TiO_2$ onto mica followed by coating the $TiO_2$ layer with powder particles of at least one of the metals cobalt, nickel, copper, zinc, tin, gold, and silver. The metallic powder layer is deposited by an electroless wet chemical process to a thickness of 5 Å to 1000 Å. Electron microaraphs showed that these particles were in the form of finely divided rods.

U.S. Pat. No. 5,573,584 discloses a process for preparing forgery proof documents by printing with interference pigments. This patent discloses the process of overcoating platelet-like silicatic substrates (micas, talc or glass flakes) with a colorless or selectively absorbing metal oxide of high refractive index, a second, non-selectively absorbing, semitransparent layer, and optionally, a third layer comprising a colorless or selectively absorbing metal oxide in combination with scattering pigments. The second, non-selectively absorbing, semitransparent layer may be composed of carbon, metals, for example those which can be applied by gas phase decomposition of volatile compounds, such as compounds of iron, cobalt, nickel, chromium, molybdenum or tungsten, or metal oxides, such as iron oxide, magnetite, nickel oxide, cobalt oxides, vanadium oxides, or mixtures thereof.

Overcoating of a base material such as a $TiO_2$-coated silicatic substrate with an outer layer of carbon, metal or metal oxide is usually accomplished in conventional processes by chemical deposition methods such as electroless plating or pyrolysis methods. Electroless plating methods involve a redox process with no extraction or supply of electric current. Pyrolysis methods rely on the thermal decomposition of a volatile compound such as a hydrocarbon or an organometallic compound whose pyrolytic decomposition product is deposited on the surface to be coated.

Electroless deposition methods and pyrolytic methods, however, produce large islands or dots of the material being deposited on the base material. Consequently, continuous coating is obtained at the expense of depositing enough coating material to sufficiently coat the gaps between such large islands or dots. This extensive deposition leads in turn to a thick coating which, because of its thickness, does not generate the best chromatic colors. In short, these conventional methods produce thick coalescence layers.

When the preservation of the surface structure of the material that is being coated is desired, a thick coalescence layer has the disadvantageous feature of significantly altering such underlying surface structure. For example, photomicrographs of $TiO_2$-coated mica that were treated in an electroless cobalt plating bath have been reported as showing finely divided rod-like particles on the surface of the $TiO_2$ layer. See, for example, U.S. Pat. No. 5,116,664, FIG. 1 and col. 6, lines 10–16, showing and describing a coating with finely divided rod-like particles.

The development of physical separation of columnar grains is not a fully understood process, and further examination of the factors that lead to a particular type of deposit formation need detailed examination. It has been reported in this respect that deposited films are in general in a state that ranges from that of being subject to tensile stresses to that of being subject to compressive stresses. See, Myong Ryeong Kim, *Magnetron Sputter Deposited CoPtCr Magnetic Thin Films For Information Storage,* at p. 73, Ph.D. Dissertation Thesis, Department of Metallurgical Engineering, The University of Utah, June 1993 (this Thesis will hereinafter be concisely referred to as "Magnetron Sputter Deposited Thin Films"). It has further been suggested in this regard that "a combination of . . . [a] residual stress contribution existing in thin film layers and a geometrical shadowing effect induces the development of physically separated columnar structure at high film thickness." *Magnetron Sputter Deposited Thin Films,* at p. 78. Nevertheless, "the exact mechanism involved in the residual stress effect is not yet clear." *Magnetron Sputter Deposited Thin Films,* at p. 80.

Chemical methods of deposition and electroless plating methods are typically limited to materials that involve hydrocarbons (liquid or gases), to organometallic compounds, and to metals, such as silver or nickel, that can readily be deposited by electroless processes. It is desirable, however, to manufacture mica interference pigments with methods that permit a much wider choice of materials. In particular, it is desirable to develop a process that can utilize materials, such as metals and sub-oxides, that can be vacuum deposited, materials, such as metal carbides, metal nitrides, metaloxynitrides, metal borides, and metal sub-oxides, that can reactively be deposited in vacuum, and materials, such as diamond-like carbon and amorphous carbon, that can be deposited by plasma-assisted vacuum methods.

Chemical methods of deposition and electroless plating methods typically generate solutions that must be disposed of, and some of these methods rely on catalytic substances that are incorporated into the pigments to an extent such that it prevents the use of the pigment in certain applications in various consumer products such as cosmetics. To avoid these problems and limitations, it is desirable to develop processes for manufacturing pigments that are more environmentally friendly and that do not rely on materials that can limit the use of the pigments. In particular, it is desirable to develop processes that reduce or eliminate the use of toxic materials and hazardous methods of deposition.

In addition to the need for developing processes for manufacturing interference pigments that can use a great variety of materials, it is also desirable to develop processes that can use cheaper materials and that permit the production of highly adherent and hard films that do not easily detach themselves from the substrate. In particular, it is desirable to provide processes that use materials other than the relatively expensive and mostly toxic metal carbonyls that typically require an investment in equipment for handling them and for monitoring their use in specially confined facilities.

SUMMARY AND OBJECTS OF THE INVENTION

It is a primary object of the invention to provide methods, systems and apparatus for the production of thin interference coatings in the form of thin coalescence films.

It is also an object of the invention to provide thin coalescence films which replicate the surface structure of the underlying substrate without forming islands, rod-like or other agglomerates in the coating that would structurally alter the underlying substrate's surface microstructure. Furthermore, these thin coalescence films exhibit enhanced colorant or pigment effects and enhanced hiding power.

To achieve the foregoing objects, and in accordance with the invention as embodied and broadly described herein, methods, systems and apparatus are provided for uniformly depositing a coating material from a vaporization source onto a powdered substrate material to form a thin coalescence layer of the coating material that smoothly replicates the surface microstructure of the substrate material. This is accomplished in a dry vacuum deposition process at low temperatures and in the absence of liquid solutions.

In particular, uniform deposition of the coating material is achieved by directing an inorganic powdered substrate material into a vacuum chamber containing a coating material vaporization source, and generating a coating material vapor from the coating material vaporization source in a low temperature dry vacuum process. The powdered substrate material is exposed to the coating material vapor in a substantially uniform manner, and a thin coalescence film of coating material is formed on the powdered substrate material that substantially replicates a surface microstructure of the powdered substrate material.

A powdered pigment material produced by the method of the invention includes a plurality of inorganic core flakes, and a first coating layer of a high refractive index dielectric material substantially surrounding each of the core flakes, with the first coating layer having an observable surface microstructure. The pigment material also includes a second coating layer of a light absorbing material substantially surrounding the first coating layer, with the second coating layer substantially replicating the surface microstructure of the first coating layer.

The pigments of the present invention exhibit enhanced hiding power, enhanced chroma on a white background and enhanced selected chromas on a black background. These pigments also exhibit a greater available color gamut.

The vapor deposition in this invention takes place at low temperature and with no reliance on solutions. These features lead to advantages such as the reduction or even elimination of the handling and disposal of byproducts and in particular hazardous materials. The hardness and good adherence exhibited by the pigments of this invention lead to advantages such as durability and the absence of rub-off coating losses.

Because of the inherent characteristics of the vacuum deposition processes utilized in the invention, the methods, systems and apparatus do not rely on catalytic species. This feature advantageously broadens the applicability range of pigments of this invention because toxic catalysts that would otherwise be incorporated into the coatings would prevent the subsequent use of pigments in certain applications.

These and other objects, features, and advantages of the present invention will become more fully apparent from the following description and appended claims, or may be learned by the practice of the invention as set forth hereinafter.

BRIEF DESCRIPTION OF THE DRAWINGS

In order to illustrate the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
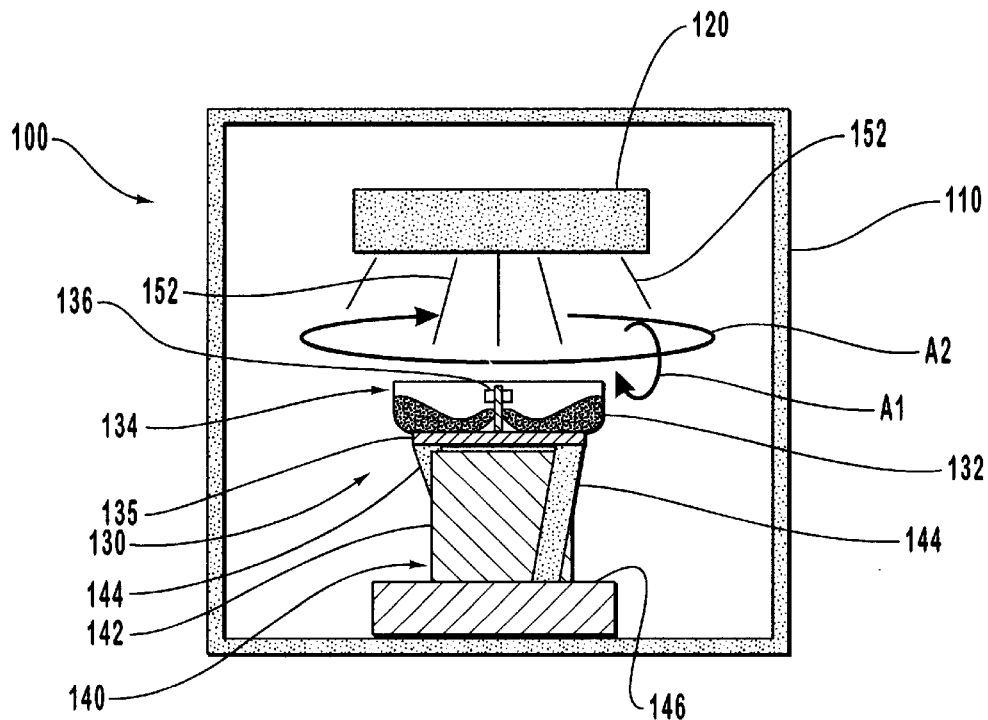
FIG. 1 shows a schematic cross-sectional view of an embodiment of the coating apparatus of the invention that has a vibrating bed.

The present invention is directed to methods, systems and apparatus for coating a powdered substrate material. The coated substrate material can be used to produce thin interference pigments with enhanced colorant effects. The coatings are deposited in the form of thin coalescence films or composite thin films which replicate the surface microstructure of the underlying substrate material.

The substrate material includes a reflecting material such as a silicatic material that is precoated with a high refractive index material. Examples of suitable silicatic materials include mica, glass flakes, talc, and combinations thereof. The high refractive index material is preferably a dielectric substance whose index of refraction is greater than about 1.65. Examples of suitable high refractive index dielectric materials include titanium dioxide, zirconium oxide, tin oxide, iron oxide, zinc oxide, tantalum pentoxide, magnesium oxide, tungsten trioxide, carbon, and combinations thereof. One preferred substrate material is a $TiO_2$-coated silicatic material such as $TiO_2$-coated interference mica.

As discussed in greater detail below, the coatings prepared according to this invention are deposited on substrate material which can subsequently be incorporated into a medium. This medium in turn produces a predetermined optical response through radiation incident on its surface. The optical response of this medium includes the enhanced colorant or pigment effects that are due to the coating deposited on the substrate material according to this invention.

The present invention provides deposition methods that produce very fine distributions of nucleation sites on the surface of the material to be coated, and in particular on the surface of TiO2-coated mica. The deposition methods and devices produce coalescence layers thin enough so as to minimally or negligibly alter the structural features of the underlaying material surface microstructure. The thin coalescence layers that can be obtained with such fine nucleation site distributions lead to comparatively thinner coatings, with better chromatic colors.

To produce a coating in the form of a thin coalescence layer, this invention relies on dry, low temperature physical vapor deposition methods and vacuum deposition sources. The low temperature vapor deposition methods and devices of this invention are hereinbelow discussed first, followed by a description of the coatings in the form of thin coalescence layers.

Low Temperature Vapor Deposition Methods

In physical vapor deposition methods, the material to be deposited has to be initially evaporated and deposition is subsequently accomplished by depositing the evaporated material on a selected substrate. The low temperature vapor deposition methods utilized in the present invention are all physical vapor deposition methods and include resistive evaporation, electron beam deposition, cathodic arc evaporation, magnetron sputtering including both planar and hollow cathode, balanced and unbalanced sputtering, as well as radio frequency sputtering.

In resistive evaporation the material is brought to the evaporation temperature with the aid of a resistance source in an evaporative source. Typically, an element made of a metal such as tungsten, tantalum or molybdenum holds the material to be evaporated and is heated by passing an intense electric current through the element.

In electron beam deposition the material is heated by bombardment with high energy electrons until the material evaporates. This technique has the ability to concentrate a large amount of power in a small surface and it thus provides temperatures that are higher than the melting and evaporation points of refractory oxides and even refractory metals used in resistive evaporation.

Arc vapor deposition uses a high intensity current, low voltage arc to vaporize a cathodic electrode (cathodic arc) or anodic electrode (anodic arc) and deposit the vaporized material on a substrate. Arc vaporization, especially cathodic arc evaporation, provides copious amounts of film-ions and reactive gas ions.

Sputtering is ejection by bombardment and sputter deposition is a non-thermal process where the atoms of the material to be evaporated are ejected upon energetic collision with impinging particles that are typically inert gaseous ions and more particularly argon cations. The inert gas ions are formed by ionizing collisions with electrons in a vacuum chamber and they are accelerated by an electric potential towards the material to be sputtered. The material that is evaporated by sputtering subsequently deposits on a substrate.

According to a basic sputtering technique, a sputtering cathode and an anode are enclosed in a chamber that contains rarefied inert gas. These electrodes are connected to a high voltage direct current (DC) power supply which accelerates inert gas cations formed in the chamber towards the sputtering cathode. The ions collide with the sputtering cathode material and vaporize the material that is subsequently deposited on a substrate interposed between the sputtering cathode and the anode. This is DC sputtering or more precisely DC diode cathodic sputtering, which typically operates at pressures in the order of $10^{-2}$ Torr.

The ion formation rate in a sputtering chamber can be enhanced by providing electrons from, for example, a source such as a heated filament. The electrons are accelerated by a discharge DC power supply. This enhancement in the electron generation rate leads to an increase in the deposition rate, and systems that operate according to this principle are known as triode sputtering systems.

A sputtering system that, instead of a high voltage DC power supply, has a radio frequency (RF) power supply and a matching chamber is a RF sputtering system. This system prevents the charge build-up in a nonconducting material that is to be sputtered and it consequently permits the sputtering of insulating materials, typically being performed at pressures of an order of magnitude as low as $10^{-4}$ Torr.

Deposition rates achieved with radio frequency sputtering systems can be further increased with magnetron sputtering. As in the previously introduced sputtering techniques, a plasma exists in the sputtering chamber of a magnetron sputtering device, but appropriately generated magnetic fields additionally force the electrons to follow paths in the region near the sputtering cathode. Accordingly, the frequency of collisions with inert gas atoms is higher and more sputtering ions are formed. The progressive increase in sputtering and deposition rates is also characterized by a correspondingly increased ability to perform the deposition at lower pressures.

In ion beam sputtering an ion source provides a focused, divergent or collimated ion beam. The ion beam, in the form of a beam plasma, is directed against a sputtering target and the sputtered atoms are deposited on a substrate.

Reactive sputtering is a sputtering process in which a gas is introduced into the chamber so it reacts with the evaporated material to form a compound that is deposited on the substrate. Even when a compound is sputtered directly, the addition of a reactive gas may be necessary to compensate for the dissociation losses of the reactive component.

Although reactive sputtering can arguably be classified as a chemical vapor deposition method, reactive methods used in this invention rely on vacuum deposition sources that are used in physical vapor deposition methods. In this sense, the reactive deposition methods of this invention are referred to in this context as physical vapor deposition methods.

Sputtering can be carried out by using "balanced" or "unbalanced" magnetic field confinement. "Balanced" magnetron or "standard" sputtering occurs when most of the magnetic field lines are confined to the target region. Unbalanced sputtering occurs when an external magnetic field is placed behind the substrate, or the magnets behind the sputtered target are of different strengths so that the ion and electron flux extends out away from the target toward the substrate. Generally, unbalanced magnetron sputtering rates are higher than for "balanced" magnetron sputtering with higher ion fluxes. Higher fluxes modify the growing deposited film to produce such changes as harder films with differing optical properties. A good review of the difference between "balanced" and "unbalanced" magnetron sputtering can be found in the following references which are incorporated herein by reference in their entirety: B. Window and N. Savvides, *J. Vac. Sci. Technol.* Vol. A4(2) 196 (1986); and N. Savvides and B. Window, *J. Vac. Sci. Technol.* Vol. A4(3) 504 (1986).

Sources of electrons that are used for heating and ionizing atoms and molecules include hot electron emitting surfaces and plasma sources. In plasma sources, electrons are magnetically deflected from a plasma. In particular, the hollow cathode electron source uses a plasma discharge in a cavity that reflects and traps electrons.

These and other deposition techniques have been described in R. Herrmann and G. Bräuer, *DC and RF-Magnetron Sputtering,* and J. Becker, *Ion Beam Sputtering,* in Handbook of Optical Properties, vol. 1, pp. 135–212, R. E. Hummel and K. H. Guenter (eds.), CRC Press (1995), which are incorporated by reference herein in their entirety.

In alternating current magnetron sputtering, e.g., "dual magnetron sputtering", the voltage between two sputter sources is alternated to facilitate the continuous sputtering of conductors that develop insulating layers in reactive sputtering. In this mode of deposition, a reactive gas such as oxygen, nitrogen, methane, and ethylene is introduced near the substrate surface in addition to the noble working gas (e.g., argon). By alternating the targets between cathodic and anodic charge, both targets remain free of insulating reactants.

The MetaMode™ process developed by Optical Coating Laboratory, Inc., (U.S. Pat. Nos. 4,851,095 and 5,225,057, which are incorporated herein by reference in their entirety), allows continuous sputtering of a metallic target where a reactive process takes place in another contiguous chamber. Such a process is useful in making $TiO_x$ or $SiO_x$ absorbing layers from Ti metal or Si metal depositions.

The use of an ion gun to bombard the surface of the growing absorber film with ions is applicable to this invention since many films need hardening to prevent the outer layer from abrading off during milling of the pigment or application (compounding in plastics or painting) to the final product. In addition charge build-up on the powders during deposition could be reduced by the application of such ions. Various means to coat such powders by ion assisted processes include ion plating, and reactive ion plating and are well known to those skilled in the art.

The coating apparatus of this invention includes a substrate exposure device. An exemplary embodiment of a substrate exposure device is a vibrating bed that has a sample receptacle, such as a pan, that is connected to a vibrating device, such as a toroidal electromagnetic vibrator. Additional exemplary embodiments of substrate exposure devices are vibrating conveyors, rotating drum coaters, oscillatory drum coaters, and free-fall chambers.

In some embodiments of this invention, the substrate exposure device is located within a rarefied chamber (hereinafter referred to as "vacuum chamber"). For example, the vibrating beds, vibrating conveyors (e.g., electromagnetic or pulsating gas-driven devices), rotating drum coaters and oscillatory drum coaters are located within a vacuum chamber. In other embodiments of this invention, the substrate exposure device itself serves as the chamber whose interior is subject to rarefaction during deposition. For example, "waterfall -equipped" chambers and free-fall chambers are embodiments of substrate exposure devices that serve themselves as vacuum chambers.

A sample of substrate material is placed in an embodiment of a substrate exposure device so that the substrate particles are uniformly exposed to the coating material. A substrate material that can be used in this invention is commercially available $TiO_2$-coated interference mica. Other suitable substrate materials include glass flakes and talc that have been precoated with a high index dielectric material. The substrate materials can be used singly or in a variety of combinations if desired.

Coating materials used in this invention include light absorbing materials, and the coating materials can be any one of a plurality of materials, such as metals, sub-oxides such as metal sub-oxides, oxides including metal oxides, nitrides such as metal nitrides and metaloxynitrides, borides such as metal borides, carbides, sulfides, carbon such as diamond like carbon and other amorphous carbon (e.g., poco, graphite or vitreous) materials. Preferred coating materials include grey metals and compounds thereof such as chromium, titanium, palladium, tin, as well as other metals such as aluminum, and combinations thereof. More generally, coating material choice in this invention includes any material that can be vacuum-deposited, reactively deposited in vacuum or deposited in plasma assisted vacuum processes. These deposition methods have previously been described.

The sub-oxides prepared in the vacuum process are deposited either by directly evaporating the sub-oxide (e.g., $TiO_x$, where x=1–1.9) or by reactively evaporating the metal in the presence of pure oxygen, moisture or air. The carbides are deposited by reactive evaporation of metals with hydrocarbon gas, such as methane. Borides are deposited with metals in the presence of diborane or halogenated borides, such as $BF_{3(g)}$. Nitrides are deposited in the presence of nitrogen gas, and oxynitrides are deposited in the presence of gas mixtures, such as oxygen/nitrogen mixtures, air/nitrogen mixtures, and water vapor/nitrogen mixtures. Ammonia may be substituted for the nitrogen if desired.

In embodiments of the substrate exposure device of this invention, the particles of the substrate material are exposed to a vacuum deposition source, such as a hollow cathode sputtering system or a DC magnetron sputtering system. For example, a DC magnetron sputter target of chromium was used to deposit a uniform layer of chromium over the surfaces of interference mica. Visual inspection revealed that the appearance of the particles went from a pale white to a visual color, and turned gray with further deposition, gray being the color of elemental chromium. Too much chromium coating resulted in the deposition layer being too thick and the coating was opaque. As long as the chromium layer was still semi-opaque (partially transmitting), enhanced color could be achieved as well as higher hiding. When the substrate was subject to vibration while being exposed in an embodiment of the substrate exposure device, the pigment could be significantly improved in color by adjusting the degree of vibration, the time of deposition, the power to the sputter target, the throw distance, and the amount of substrate pigment being coated.

In addition to a substrate exposure device, embodiments of the coating apparatus of this invention also have a vacuum deposition source as a coating material vaporization source. Exemplary configurations of these elements are illustrated by the embodiments disclosed hereinbelow.

Any of the embodiments of the coating apparatus of this invention herein disclosed provides effective and uniform exposure of the substrate material powder. This means that statistically all the sides of the substrate material powder particles are approximately equally exposed to the coating material that is to be deposited on them. This type of exposure is hereinafter referred to as "uniform exposure".

FIG. 1 schematically shows a vertical cross-sectional view of a coating apparatus 100 according to one embodiment of the invention, in which a vacuum chamber 110 encloses a coating material vaporization source 120 and the substrate exposure device that is embodied by a vibrating bed 130. A powdered substrate material 132, such as $TiO_2$-coated mica, is placed in a rotatable container 134, which is operatively connected to a vibrator 140. In one embodiment, container 134 is located on and attached to a base 135 by a conventional fastener 136. In other embodiments, base 135 is integrally attached to container 134, or base 135 forms the base of container 134 itself. Container 134 is more particularly embodied by any receptacle that can effectively hold substrate material 132 while it is being coated, such as a bowl-shaped container, a dish or a pan.

The vibrator 140 comprises a vacuum sealed electromagnet 142. In this embodiment, base 135 is made of a magnetic material, preferably magnetic steel. Furthermore, flat springs 144 connect base 135 with the bottom of electromagnet 142 or with a fixed surface 146 so that base 135 is prevented from contact engagement with electromagnet 142, and base 135 can move without experiencing collisions against any other part of electromagnet 142. During operation of coating apparatus 100, substrate material 132 undergoes a substantially helical motion that is represented in FIG. 1 by arrows A1 and A2. This continuous mixing of substrate material 132 in container 134 provides for a good statistical distribution of the thickness of the deposited coating on the substrate material.

The coating material is vaporized from coating material vaporization source 120, which in one embodiment of this invention is an evaporative source. In other embodiments of this invention coating material vaporization source 120 is a magnetron sputtering unit or any of the vacuum deposition sources described hereinabove. As depicted in FIG. 1, a flow 152 of vaporized coating material emanates from coating material vaporization source 120 to reach and coat substrate material 132.

When electromagnet 142 was operated in the approximate voltage range of 0–50 V at 60 Hz, it generated an alternating magnetic field that successively attracted and released base 135 at a frequency of 60 Hz, thus causing partially circular up-and-down oscillations of bowl-shaped container 134. When electromagnet 142 was turned on, an alternating magnetic field attracted base 135 to the top of electromagnet 142 and released it with the frequency of 60 Hz. Flat springs 144 did not let base 135 contact the top of electromagnet 142 and returned base 135 to the original position every time when the field changed its polarity. With these oscillations imparted to container 134, substrate material 132 was continuously mixed and effectively and uniformly exposed to the vaporized material that deposited on the surface of the particles of substrate material 132.

The appropriately rarefied environment in the chamber where deposition takes place in the embodiment schematically shown in FIG. 1 or in any other embodiment disclosed hereinbelow is achieved with the aid of conventional vacuum pumping systems. These systems typically include a cryopump, a diffusion pump coupled to a mechanical pump or other suitable vacuum pump, or combinations thereof, with the suitable vacuum lines and exhaust ports. These systems are known to those skilled in vacuum technology and are not further discussed here.

In preferred embodiments, the size of the vibrator bowl can range from 4 inches to about one foot in diameter. The vibrator should be so constructed that little outgassing occurs from its components, and preferably, stainless steel is used in its construction. Embodiments of coating material vaporization source 120 (also referred to as sputtering target or simply target) may be any shape including annular or rectangular. A preferred embodiment for chromium deposition comprises a water cooled DC magnetron with a chromium target having dimensions of 12 inches by 4.4 inches by 0.50 inches thick. Annular targets having radii from about 4–9 inches could be used as well as larger rectangular targets up to about 11 inches by about 4 feet long. By using multiple cathodes arranged in a square with multiple vibrating bowls, large volumes (about 5 pounds) of pigment can be produced in one batch operation. In an embodiment with a small 4-inch radius vibrator bowl and one overhead coating material vaporization source, about 10 grams of pigment could be effectively processed.

Figure 2:
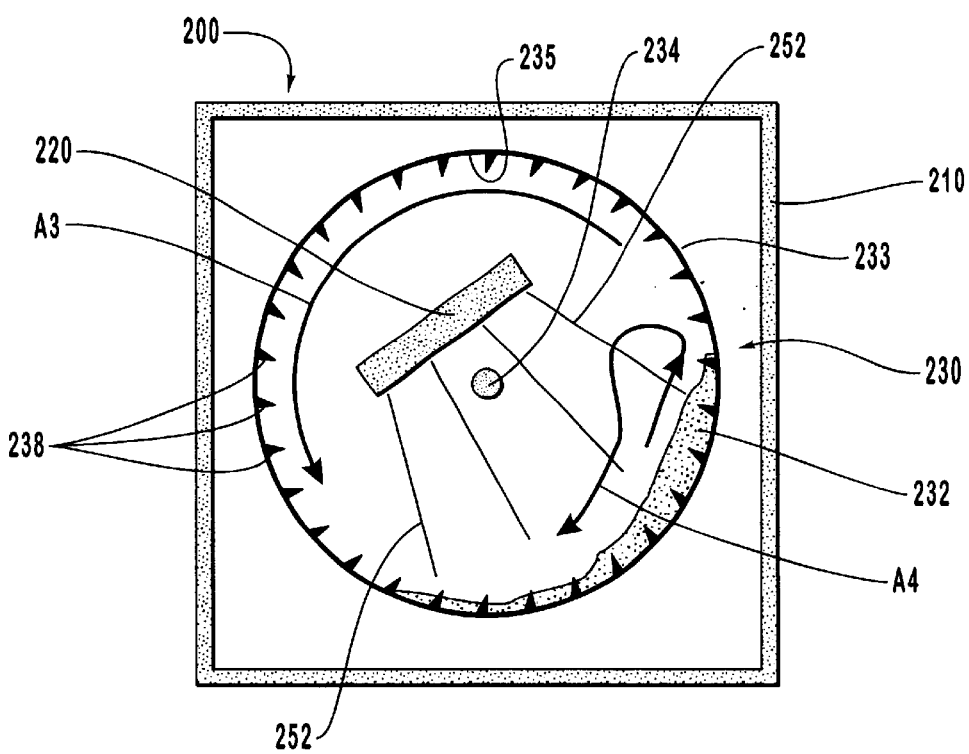
FIG. 2 shows a schematic cross-sectional view of an embodiment of the coating apparatus of the invention that has a rotating drum coater.

FIG. 2 schematically shows a vertical cross-sectional view of a coating apparatus 200 according to another embodiment of the invention, in which a vacuum chamber 210 encloses a coating material vaporization source 220 and the substrate exposure device that is embodied by a rotating drum coater 230. A substrate material 232, such as $TiO_2$-coated mica, is placed in a hollow drum 233 which is rotated as indicated, for example, by arrow A3 under the power delivered at a chosen angular frequency by a shaft 234. The interior wall 235 of drum 233 is so manufactured as to provide for the effective mixing and uniform exposure of substrate material 232.

A plurality of ledges 238 extend generally inwards from interior wall 235 of drum 233 so that, upon revolving drum 233, ledges 238 lift a certain amount of the powder of substrate material 232. As drum 233 continues turning, the powder of substrate material 232 falls back downwards thus undergoing the efficient mixing that leads to uniform exposure and subsequent deposition of coating material. The ledges 238 are arranged so that the powder of substrate material 232 preferably falls back in such a way that most of the powder is effectively exposed to the flow of coating material. For example, in the arrangement depicted in FIG. 2, this is accomplished by forcing the powder to fall back shortly after each ledge has passed the relevant equatorial zone of the drum, forcing the powder to undergo a motion schematically indicated by arrow A4. The ledges 238 are arranged differently in other configurations so as to provide the desired uniform exposure of the powder of substrate material 232 depending on how and where coating material vaporization source 220 is located within vacuum chamber 210. Furthermore, other features that accomplish an equivalent result can be used instead of ledges 238, such as flanges, bars, paddles, and blades.

The coating material is vaporized form coating material vaporization source 220, which in one embodiment of this invention is a physical evaporative source. In other embodiments of this invention coating material vaporization source 220 is a magnetron sputtering unit or any of the vacuum deposition sources described hereinabove. As depicted in FIG. 2, a flow 252 of vaporized coating material emanates from coating material vaporization source 220 to coat substrate material 232.

The drum coater 230 is a preferred exemplary embodiment of a coater of this invention that is in other embodiments shaped like a generally rotary cylindrical coater, or in general like a rotary container that is suited for mixing the powder of substrate material 232 and exposing it to vaporized coating material.

The rotating drum coater has been described previously. Teer, in *Reactive Magnetron Sputter Barrel Ion Plating,* as reported in Conference Proceedings IPAT 91, pp. 303–308, Brussels, Belgium, which is incorporated herein by reference in its entirety, shows a typical drum or barrel coater in FIGS. 1–3 which has a diameter of about 2 feet. However, there are physical constraints in making a bigger chamber, such as a chamber 6 feet in diameter. The two-foot chamber used was equipped with a sputtering system in which the deposition occurred downward on powder flowing across the bottom inside of the rotating drum. The interior of the barrel was provided with angled bars which allowed the pigment to be agitated uniformly and not lost to the ends of the barrel.

Figure 3A:
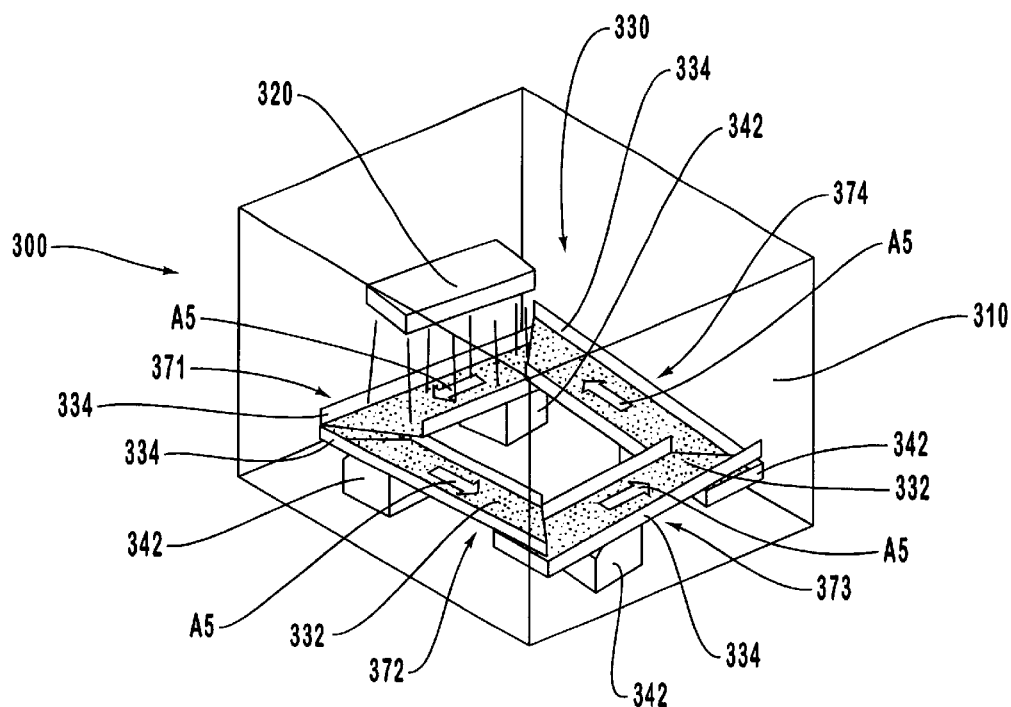
FIG. 3A shows a schematic perspective view of an embodiment of the coating apparatus of the invention that has an electromagnetic conveyor coater.

FIG. 3A schematically shows a perspective view of a coating apparatus 300 according to a further embodiment of the invention, in which a vacuum chamber 310 encloses both a coating material vaporization source 320 and the substrate exposure device, which is embodied by a vibrating conveyor coater 330. As shown in FIG. 3A, vibrating conveyor coater 330 preferably has four conveyors 371, 372, 373, and 374 which are disposed so that the powder of a substrate material 332 effectively circulates counterclockwise as indicated by arrows A5. While the powder circulates along this path, it is effectively mixed so that its exposure to the vaporized coating material is uniform. Efficient mixing also occurs at the end of each conveyor as the powder drops in a waterfall off of one tray and onto the next. The vaporized coating material is provided by coating material vaporization source 320, which in one embodiment of this invention is a physical evaporative source. In other embodiments of this invention coating material vaporization source 320 is a magnetron sputtering unit or any of the vacuum deposition sources described hereinabove.

Figure 3B:
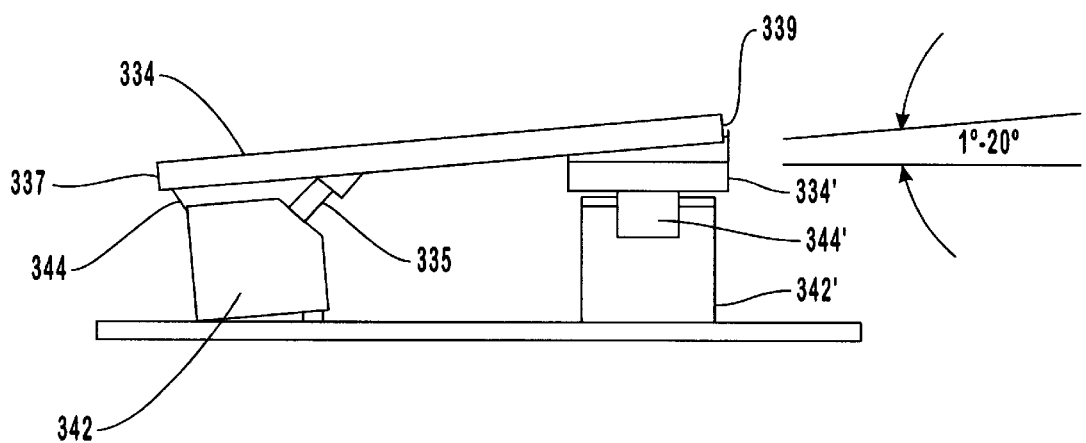
FIG. 3B shows a side view of the electromagnetic conveyor coater that is part of the embodiment shown in FIG. 3A.
Figure 3C:
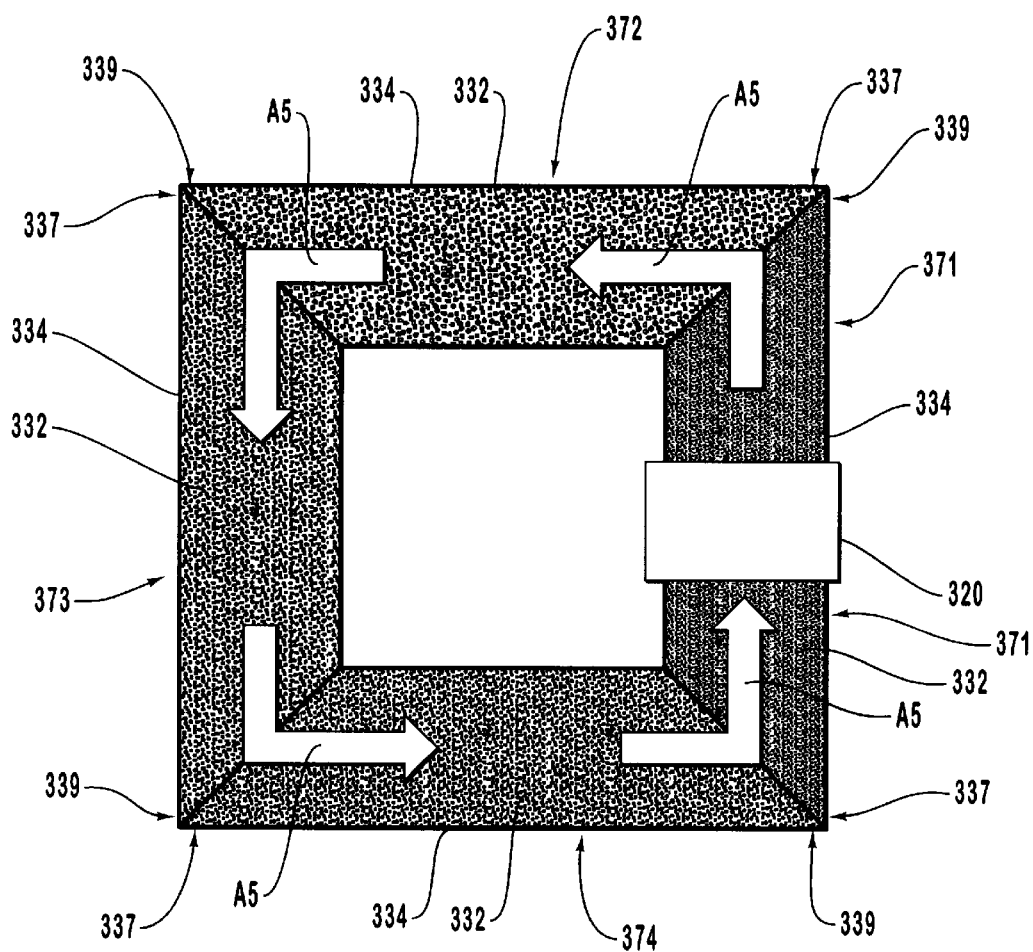
FIG. 3C shows a top view of the embodiment shown in FIG. 3A.

A vibrating means is provided to force the powder of the substrate material 332 to circulate. For example, in one embodiment, vibrating conveyor coater 330 can be associated with a plurality of electromagnets 342 which act as the vibrating means. FIG. 3B schematically shows a side view of conveyor coater 330, and in particular, the components of the electromagnetic conveyors which include a tray 334, a shaft 335, an electromagnet 342, and a spring 344. The tray 334 can be made of a variety of materials, and preferably is made of stainless steel. As indicated in FIG. 3B, tray 334 is longitudinally tilted with respect to the horizontal plane by an angle that is preferably between about 1° and about 20°, and more preferably between about 1° and about 5°. In this arrangement, electromagnet 342 is located near a lower end 337 of tray 334 and preferably under such lower end. A higher end 339 of tray 334 is preferably cut as shown in FIG. 3C, preferably at an angle of about 45° with respect to the longitudinal axis of tray 334. One end of spring 344 is preferably attached to electromagnet 342 and its opposite end is attached at a point near lower end 337 of tray 334. Similarly, one end of shaft 335 is attached to electromagnet 342 and the opposite end is attached preferably to a region under tray 334 that is located between the half-length point of tray 334 and lower end 337. Furthermore, shaft 335 is conventionally attached to electromagnet 342 to effectively force tray 334 to oscillate according to corresponding oscillations generated by electromagnet 342. The restoring effect of spring 344 effectively creates a torque that tends to restore tray 334 to the position that it had prior to the displacement caused by electromagnet 342 acting upon shaft 335. The overall dynamic behavior of tray 334 coupled with spring 344 and shaft 335 is such that the powder of substrate material 332 is effectively forced upwards from lower end 337 to higher end 339 along tray 334.

In other embodiments of the vibrating conveyor coater of the present invention, the vibrating tray can be energized by other vibrating means such as a pulsating gas-driven device. For example, a pulsating air piston known as a pneumatic drive, attached to the vibrating tray, can be used to induce the vibrating motion in the tray. Such pneumatic drive systems are available from Martin Engineering (Livonia, Mich.).

Each one of trays 334 in the embodiment schematically shown in FIG. 3A is disposed so that each higher end 339 is located above lower end 337 of the next tray along the overall circulation path of substrate material 332. This arrangement is shown in the perspective view of FIG. 3A and in the side view of FIG. 3B. When conveyor coater 330 has four conveyors, they are disposed with respect to each other in the above described configuration at preferably about 90° angles, as shown in the perspective view of FIG. 3A and in the top view of FIG. 3C.

FIG. 3B shows tray 334 lengthwise and also shows an end view of the following tray, electromagnet and spring in the sense of circulation of substrate material 332. Primed and unprimed numbers in FIG. 3B label analogous elements in the lengthwise view and in the end view, respectively.

FIG. 3C shows a top view of the embodiment shown in FIG. 3A, where differently shaded areas represent different trays 334 of different conveyors 371–374 forming a closed-loop square array. As schematically shown in FIG. 3C, the powder of substrate material 332 is forced to move by the vibration of tray 334 along conveyor 371, and is coated with the vaporized coating material from coating material vaporization source 320. The coated powder then drops off at the higher end 339 of conveyor 371 onto lower end 337 of conveyor 372. Consequently, the powder moves along the path indicated by arrows A5. The overall powder flow changes travel direction by approximately 90° when it is dropped from one conveyor to the next conveyor along the path. In addition, the powder falls several inches when it is delivered from one conveyor to the following conveyor so that the powder is thoroughly mixed to provide uniform exposure to the vapor of the coating material that is to deposit on and coat substrate material 332. The approximately 45° cut at the higher end 339 of each tray 334 permits a uniform fall of the powder onto the entire width of the lower end 337 of the following tray.

The counterclockwise overall circulation of substrate material 332 as shown in FIGS. 3A and 3C is merely illustrative of one possible circulation in an embodiment of this invention. Modifications to the devices shown in FIGS. 3A, 3B and 3C could be made by one of ordinary skill in the art to produce another embodiment of this invention in which the overall circulation of substrate material 332 is clockwise.

In a typical embodiment of the vibrating conveyor coater, tray dimensions are about 28 inches long by about 7 inches wide, although commercially available conveyors come in lengths up to 30 feet and widths up to 2 feet. Multiple two-foot wide sputter targets would allow deposition through the length of the larger vibrating trays. Instead of a square arrangement, embodiments of this device could have triangular tray arrangements, pentagonal arrangements, hexagonal arrangements, or arrangements in some other shape. Still another embodiment of this device could have a long vibrating tray with multiple overhead evaporating sources. Vibrating conveyors of this type are available from ARBO Engineering (North York, Ontario, Canada) and Eriez (Erie, Pa.). The preferred arrangement is the square arrangement of vibrating trays with four waterfalls at each 90° turn.

Figure 4A:
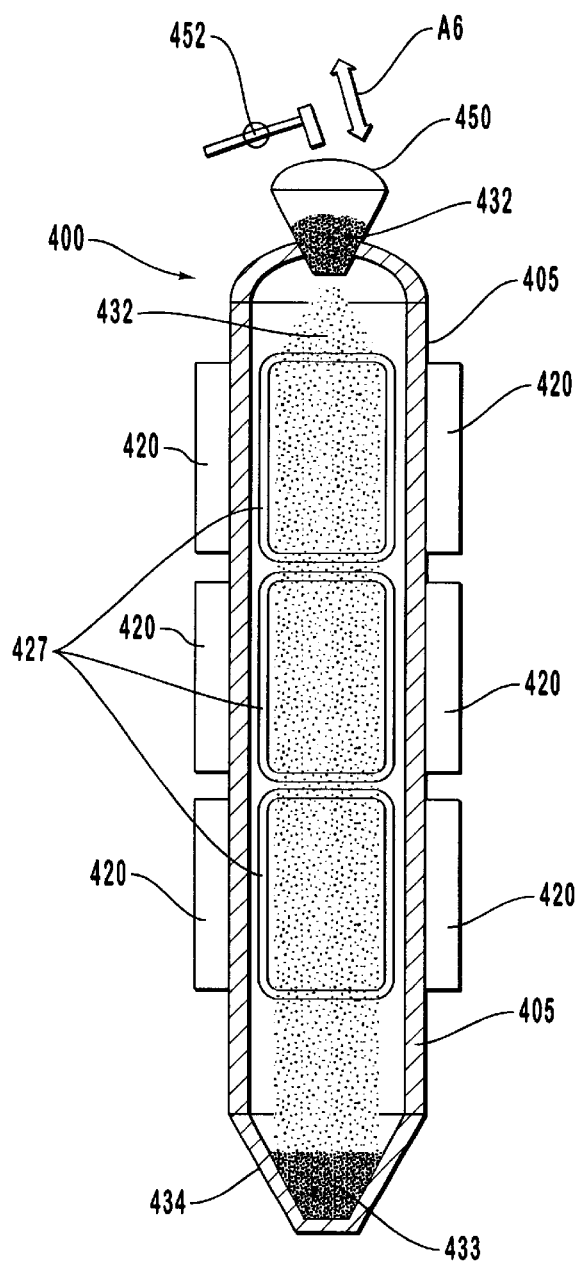
FIG. 4A shows a schematic cross-sectional view of an embodiment of the coating apparatus of the invention that has a free-fall tower.

FIG. 4A schematically shows a vertical cut-away view of a coating apparatus 400 according to another embodiment of the invention, in which the vacuum chamber comprises a tall and narrow elongated coating tower structure such as a free-fall tower 405 with a series of mounted coating material vaporization sources 420 and a container 450 for a substrate material 432. The tower 405 is provided with a receptacle 434 to collect and facilitate the subsequent retrieval of a coated substrate material 433.

In one embodiment of coating apparatus 400, coating material vaporization sources 420 are magnetrons. In another embodiment, coating material vaporization sources 420 are hollow cathode sputtering systems.

Figure 4B:
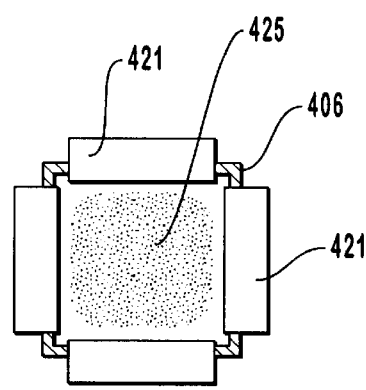
FIG. 4B shows a square arrangement of coating material vaporization sources.
Figure 4C:
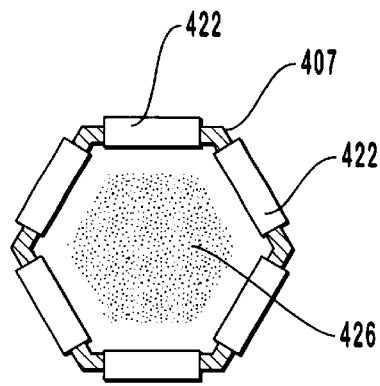
FIG. 4C shows a hexagonal arrangement of coating material vaporization sources.

When magnetrons are utilized for vaporization sources 420, the magnetrons can be mounted in a variety of configurations, but preferably they are mounted in a square or hexagonal configuration, as shown in FIGS. 4B and 4C. These figures schematically illustrate cross-sectional views of coating apparatus 400 taken in a plane that is orthogonal to the tower's longitudinal axis. FIG. 4B shows a cross-sectional view of a square tower 406 with four magnetrons 421. FIG. 4C shows an analogous cross-sectional view of a hexagonal tower 407 with six magnetrons 422. Square and hexagonal shaded regions 425 and 426 schematically illustrate the region into which the plasma in towers 406 and 407, respectively, is confined by the magnetic fields of the corresponding magnetrons 421 and 422. In general, magnetrons are preferably installed over all sides of the coating tower to increase the deposition rate of the coating material onto the powder particles of substrate material 432.

The container 450 is provided with a mechanism for appropriately releasing substrate material 432 into tower 405. In the embodiment illustrated in FIG. 4A, this mechanism is exemplary embodied by a percussion mechanism such as a hammer 452 that, as indicated by double arrow A6, forces the release of substrate material 432 by appropriately shaking container 450. This can also be achieved by any other mechanism that produces a similar effect, such as a vibrator.

As schematically shown in FIG. 4A, after substrate material 432 has been released from container 450, substrate material 432 falls down through a series of plasma regions 427 and past coating material vaporization sources 420. Because of convection and plasma forces, the powder particles spiral down to the bottom where they are collected in receptacle 434. The movement of the powder particles during fall allows for uniform exposure and deposition of a coating material thereon.

Figures 5A, 5B:
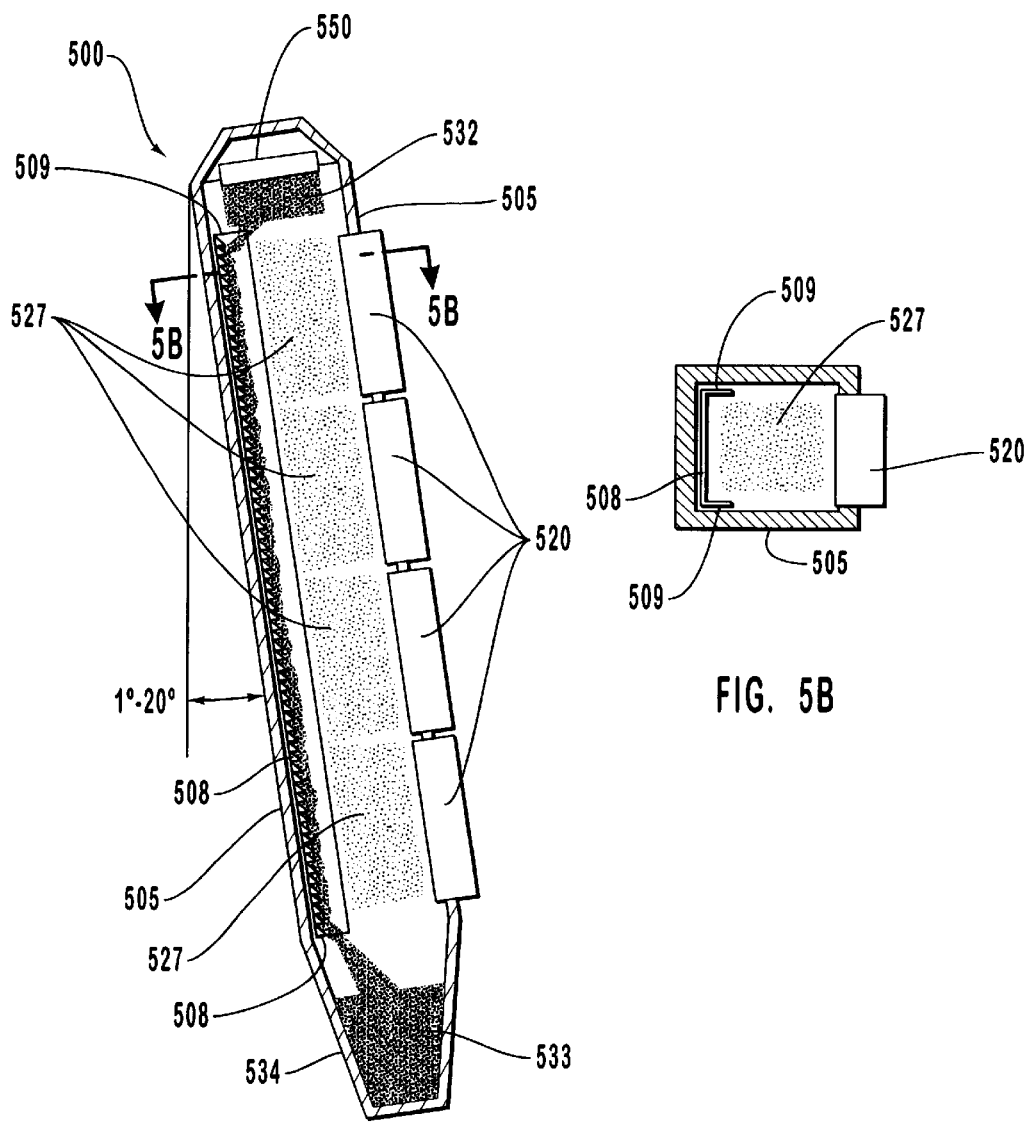
FIG. 5A shows a schematic cross-sectional view of an embodiment of the coating apparatus of the invention that has an oblique tower.
FIG. 5B shows a cross-sectional view of the device shown in FIG. 5A in a plane that is orthogonal to the longitudinal axis of the embodiment shown in FIG. 5A.

FIG. 5A schematically shows a vertical cross-sectional view of a coating apparatus 500 according to an additional embodiment of the invention, in which the vacuum chamber comprises a tall and narrow oblique coating tower 505 with a series of mounted coating material vaporization sources 520 and a container 550 for a substrate material 532. The tower 505 is provided with a receptacle 534 to collect and facilitate the subsequent retrieval of a coated substrate material 533. In one embodiment, coating material vaporization sources 520 are magnetrons.

The tower 505 stands at an angle preferably in the range of about 70–89° relative to a horizontal plane intersecting the longitudinal axis of tower 505. Equivalently, tower 505 stands at an angle preferably in the range of about 1°–20° relative to a vertical axis, as shown in FIG. 5A.

Coating material vaporization sources 520, such as magnetrons, are mounted on one wall of tower 505. Within tower 505, a device is generally disposed along the wall opposite vaporization sources 520 to force particles of substrate material 532 to undergo a motion such that it renders them fully and uniformly exposed to the coating material that emanates from vaporization sources 520. In one embodiment, this device is a vibrating tray 508 with ledges that is longitudinally disposed along the wall opposite vaporization sources 520. In another embodiment, this device is a stationary tray with ledges that is generally disposed as tray 508.

FIG. 5B schematically shows a cross-sectional view of coating apparatus 500 in a plane that is orthogonal to the longitudinal axis. As shown in FIG. 5B, tray 508 is provided with longitudinally extending lateral flanges 509 that confine the particles as they run downward over the ledges of tray 508.

During operation of coating apparatus 500, a mechanism such as a vibrator or a similar device forces substrate material 532 to be released from container 550 and to fall down on tray 508. Particles of substrate material 532 slide along the ledges of tray 508, flipping and mixing, and pass through a series of plasma regions 527. The particles are uniformly exposed and coated with the coating material that emanates from coating material vaporization sources 520, resulting in coated substrate material 533 which is collected in receptacle 534.

Preferred embodiments of the towers schematically shown in FIGS. 4A and 5A are typically about 3 feet in diameter and about 6 feet long. These embodiments also include (not shown in FIGS. 4A–5A) a return mechanism to the top of the tower for further processing of the pigment, if necessary. The pigment is circulated through the tower as many times as necessary until the desired color is achieved. The return mechanism can be embodied by a screw conveyor or by a ferris wheel arrangement to reload the powder at container 450 or 550 from the respective receptacle 434 or 534. The sputter targets are of suitable dimensions to fit within the chambers.

Thin Coalescence Layer Coatings

The chromatic properties of the coated particles produced according to the invention are quantitatively described with reference to color measurement standards that are briefly summarized as follows.

In order to quantify the perceived color of a particular object, it is useful to invoke the XYZ tristimulus color coordinate system developed by the Commission Internationale de l'Éclairage (CIE), which is now used as a standard in the industry in order to precisely describe color values. In this system, colors can be related completely and accurately through the variables X, Y, and Z, which are determined mathematically as the integrals of three distribution functions covering the visible spectrum, which ranges from about 380 nm to about 770 nm, with the reflectance or transmittance curve and the energy distribution of the light source. The variables x, y, and z, which are normalized values of X, Y, and Z, respectively, are known in the art as the chromaticity coordinates, and are routinely used in the industry to quantify aspects of color such as purity, hue, and brightness.

Another color coordinate system developed by CIE defines color characteristics which account for the dependence of color sensitivity of the eye on viewing angle in terms of $X_{10}Y_{10}Z_{10}$ tristimulus values. These values may be used for viewing angles greater than 4° (and are exact for a viewing angle of 10°), while the values X, Y, and Z are reserved for viewing angles specified for a 4° angle or less.

The parameters X, Y, and Z are defined by the following equations:

$$X = K \int S(\lambda) x'(\lambda) R(\lambda) d\lambda$$

$$Y = K \int S(\lambda) y'(\lambda) R(\lambda) d\lambda$$

$$Z = K \int S(\lambda) z'(\lambda) R(\lambda) d\lambda$$

where $K = 100/(\int S(\lambda) y'(\lambda) d\lambda)$ $S(\lambda)$ is the relative spectral power distribution of the illuminant;

$x'(\lambda)$, $y'(\lambda)$, and $z'(\lambda)$ are the color matching functions for a specified angle; and $R(\lambda)$ is the spectral reflectance of the specimen.

The chromaticity coordinates, x, y, and z can be calculated from the X, Y, Z tristimulus values through the following formulae:

$$x = X/(X+Y+Z)$$

$$y = Y/(X+Y+Z)$$

$$z = Z/(X+Y+Z) = 1-x-y.$$

From the x, y, z chromaticity coordinates, a useful diagram known as the "chromaticity diagram" can be plotted, wherein the loci of x and y values correspond to all real colors; which in conjunction with the human eye response function and the third dimension of brightness (which may be conveniently plotted on an axis perpendicular to the chromaticity plane), can be used to completely describe all aspects of perceived color. This system of color description is particularly useful when a quantitative comparison of color attributes is required.

The chromaticity plane may be described in a variety of ways; however, a standard in the industry is known as the L*a*b* color space defined by CIE (hereinafter referred to as the "CIELab space"). In this color space, L* indicates lightness and a* and b* are the chromaticity coordinates. In an L*a*b* chromaticity diagram, the a* axis is perpendicular to the b* axis, with increasingly positive values of a* signifying deepening chroma of red and increasingly negative values of a* signify deepening chroma of green. Along the b* axis, increasingly positive values of b* signify deepening chroma of yellow, whereas increasingly negative values of b* indicate deepening chroma of blue. The L* axis indicating lightness is perpendicular to the plane of the a* and b* axes. Colors with no chroma always have the value a*=b*=0. The L* axis along with the a* and b* axes provide for a complete description of the color attributes of an object.

The L*a*b*color system allows for a comparison of the color differences between two measurements through a metric, namely ΔE, which indicates the change in color as measured in the L*a*b* color space. The numerical value for ΔE is calculated through the following equation using the measured L*a*b* values:

$$\Delta E=[(\Delta L^*)^2+(\Delta a^*)^2+(\Delta b^*)^2]^{1/2}$$

where the symbol α denotes a difference in measurements taken, for example, at two different angles (e.g., 0° incidence and 45° incidence), or a difference in measurements taken for a reference standard and a sample.

In general, three items are needed to specify our perception of a given beam of light. The L*a*b* set of coordinates is one of such sets of three items. Another set incorporates lightness, L*, but instead of the coordinates a* and b*, it uses the coordinates C* and h, that stand for chroma and hue, respectively. Chroma measures color saturation. Increasing fading corresponds to lower saturation. Hue corresponds with the dominant saturated color.

Color differences can also be expressed as a function of differences in lightness, chroma and hue by the expression:

$$\Delta E=[(\Delta L^*)^2+(\Delta C^*)^2+(\Delta H^*)^2]^{1/2},$$

where C* stands for chroma and ΔH* for change in metric hue. The metric hue, h, is defined by $$h=\arctan(b^*/a^*)$$

and the chroma, C*, is defined by $$C^*=[a^{*2}+b^{*2}]^{1/2}.$$

The widely used CIELab color space is adequate for describing pigments of a single color. However, color-shifting pigments such as light interference pigments represent a significant challenge in color measurement. To quantify the dramatic hue shift and chroma of these colorants, metrologists at Flex Products, Inc., developed a new color measurement metric known as Dynamic Color Area™ (hereinafter "DCA™"). See Flex Products to Technical Bulletin No. TB-02-98, which is hereby incorporated by reference herein in its entirety. Measurements to compute the DCA™ metric are taken at a viewing geometry known as near specular multi-angle geometry, where the aspecular view angle is fixed relative to the corresponding specular angle. The fixed aspecular angle is maintained at all selected angles of illumination. It is measured using a goniospectrophotometer, which is an instrument that allows for the configuration of nearly 300 distinct measurement geometries. In addition, the DCA™ metric can also be applied to other multi-angle measurement geometries. Calculating the DCA™ metric under two different geometries allows for a comparison of pigment appearance under two simulated viewing environments.

To generate the DCA™ diagram using the aspecular angle geometry, a series of readings are taken with a goniospectrophotometer at angles from 10° to 60° incidence in 5° increments. These readings are plotted in a CIELab color space. Lines are drawn connecting the plot points and connecting the 10° and 60° measurements to the achromatic point (a*=0, b*=0), thus defining a function f(a*, b*). The DCA™ metric is represented by the area in the a*-b* plane defined by the unction f(a*, b*). The larger the area defined by the DCA™ metric for a given pigment, the larger that pigment's color gamut.

More explicitly, the DCA™ metric is described as a defined surface integral $$\int\int f(a^*, b^*) db^* da^*$$

where the integrations are performed between the lower and upper limits $b_1$, $b_2$, respectively, for b*, and the lower and upper limits $a_1$, $a_2$, respectively, for a*. This double integral provides an area in the a*-b* plane of the CIELab space. This area, and thus the DCA™ metric, is measured in square CIE units.

Experiments in the context of this invention were performed with commercially available $TiO_2$-coated interference mica. The $TiO_2$-coated mica having the colors of Super Green Pearl, Violet Pearl and Gold Pearl under the tradename MasterTint® was obtained from DuPont. $TiO_2$-coated mica under the tradename Iriodin® was also obtained from E. Merck (Darmstadt, Germany). Samples of Iriodin® 221 Blue, Iriodin® 289 Flash Interference Blue, and Iriodin® 299 Flash Interference Green were used. A sample under the Mearlin tradename labelled Super Red Mearlin Luster pigment was obtained from the Englehard Corporation (Ossining, N.Y.). Similar interference mica can be obtained from Kemira Oy (Pori, Finland), under the tradename Flonac. The substrate material was placed in a coating apparatus according to this invention, for example, a vibrating bed in a vacuum chamber. Other experiments used a rotating or an oscillatory drum coater, electromagnetic conveyors, or free falling coating towers.

The structure of the pigment produced with this invention, particularly when the coating material is a metal, is markedly different from the structure of the pigments produced according to conventional methods. Electroless deposition and pyrolytic decomposition methods of organometallic compounds produce large islands or dots of metal. If these deposition methods are prolonged to induce a continuous coating, the absorber coating becomes too thick at coalescence to produce the best chromatic colors. In contrast, the physical vapor deposition processes of this invention produce a very fine distribution of nucleation sites on the surface of the substrate material, such as the surface of $TiO_2$-coated mica, which in turn produce a very thin coalescence thickness.

In this invention, the coating is not composed of dot-like or rod-like formations, and the continuous covering is achieved at a much thinner coverage than with other methods, such as electroless or chemical vapor deposition processes. Metals and other materials deposited by physical vacuum processes according to the invention can have a thickness of about 30–150 Å, and coalesce at thicknesses that are as small as about 30–50 Å. For example a coalescence thickness of about 40 Å was commonly achieved in the experiments performed in the context of this invention.

Deposition according to this invention is supplemented in some embodiments with a process for altering the chemical makeup of the deposited material. In one embodiment of this invention, the deposited material is oxidized, forming a somewhat thicker layer that increases the durability of the final pigment. For example, the pigment product can be baked after vacuum deposition to produce a thicker oxide layer, since a metal layer would be oxidized somewhat after the heating process. The thickness of the layers of deposited material that are obtained in this way can be up to about 150 Å while still replicating the underlying structure of the material on which deposition takes place.

In addition to the structural and optical properties of the coatings produced with the apparatus, systems and methods of this invention, the dry processes of this invention are more environmentally friendly and comparatively less hazardous than conventional techniques because the processes of this invention do not produce waste solutions that must be disposed of following the coating processes. In addition, the methods of this invention do not require the incorporation of catalytic ions such as palladium or tin ions that are necessary elements in electrochemical wet chemical methods. The use of such ions may disadvantageously prevent the subsequent use of the manufactured pigments in various consumer products. Furthermore, the methods and systems of this invention require no high heating or any pyrolysis. Instead, the coating is deposited by the apparatus and systems and according to the methods of this invention by a dry, low temperature (less than about 200° C.) process rather than a wet chemical process or a pyrolytic process. More precisely, "dry" in the context of this invention stands for the non-reliance on solutions by the deposition methods. Instead, the dry methods of this invention are implemented under conditions that are typical of physical vapor deposition techniques.

The coatings deposited according to this invention are highly adherent, hard films that do not rub-off, unlike prior coatings such as carbon coatings that are deposited by pyrolytic processes. Organometallic compounds are more expensive than the materials used in physical deposition methods, and some of these compounds are toxic, a property that requires investment in equipment for handling the compounds themselves and for monitoring the processes in which they are used.

Elements of the embodiments of the coating apparatus of this invention disclosed hereinabove, equivalents thereof, and their functionalities can be expressed as means for performing specified functions as described hereinbelow.

Examples of means for directing an inorganic powdered substrate material into a vacuum chamber include any of a variety of conventional conveying devices known to those skilled in the art of vacuum deposition processing.

Examples of means for generating a coating material vapor include any one of a plurality of coating material vaporization sources such as sputtering sources including sputter magnetrons, hollow cathode sputtering systems, tri-ode sputtering systems, RF sputtering systems, ion beam sputtering sources, hollow cathode sputtering systems, and reactive sputtering sources; evaporative sources; electron beam deposition sources, and arc vapor deposition sources including cathodic arc vapor deposition sources and anodic arc vapor deposition sources.

Examples of means for uniformly exposing powdered substrate material include any of a plurality of substrate exposure devices that uniformly expose substrate material powder in a rarefied environment to coating material vapor, such as vibrating beds and conveyors, rotating drum coaters, electromagnetic conveyor coaters, and coating towers including straight and oblique towers.

Examples of a means for providing a rarefied environment for vapor deposition include any one of a variety of vacuum pumping systems including cryopumps, other vacuum pumps and combinations thereof, with the appropriate vacuum lines and exhaust ports.

Feeding mechanisms such as a container coupled to a percussion device or to a vibrator are examples of means for supplying powdered substrate material. These mechanisms and equivalents thereof supply powder substrate material to means for uniformly exposing substrate material powder. Containing devices such as a receptacle are examples of means for collecting coated substrate material powder. Feeding mechanisms and equivalents thereof, and containing devices and equivalents thereof are appropriately placed so that they do not interfere with the uniform exposure of the substrate material powder to the coating material vapor, so that they do not impede the deposition of the coating material vapor onto the substrate material powder, and so that the rarefied conditions in which the vapor deposition takes place are preserved.

EXAMPLES

The following examples are given to illustrate the present invention, and are not intended to limit the scope of the invention. The examples utilize the L*a*b* or the L*C*h color space as described above in order to evaluate color shifting properties of the coatings of this invention.

Example 1

Gold Pearl interference pigment was first washed in acetone and dried in an air oven. The dried pigment was then placed in a cooled dish placed in a vacuum chamber pumped to a pressure of about $1 \cdot 10^{-4}$ Torr and subjected to DC magnetron coating of chromium in an Ar pressure of about $2.5 \cdot 10^{-3}$ Torr.

Example 2

Super Green Pearl pigment was similarly washed and dried as described in Example 1. It too was exposed to sputter deposition of chromium while being subjected to vibrational movement.

Example 3

Violet Pearl pigment was treated as described in Example 1. It was also sputter coated with chromium.

Example 4

Iriodin® 221 Blue pigment was coated with chromium in a barrel vacuum coater equipped with two chromium magnetron sources measuring 5"×15" in size. The magnetrons were run at about 3 A at 3 mTorr Ar for between 6 and 20 min depending on the color enhancement required. A mass of about 25–50 g of powder was processed without any pre-treatment, washing or drying.

Example 5

289 Flash Interference Blue pigment was coated with Cr by the same process as described in Example 4.

Example 6

299 Flash Interference Green pigment was coated with Cr by the same process as described in Example 4.

Example 7

Super Red Mearlin® Luster pigment was coated with Cr by the same process as described in Example 4.

Example 8

The pigments identified in Examples 1–7 were utilized with no additional coating as control pigments. Cr-coated pigments according to Examples 1–7 and the control pigments were sprayed onto white and onto black coated paper panels to produce test samples. The sprayed materials included 25% by weight of pigment loading in an acrylic-melamine binder. The dried sprayed material was about 1 mil thick. The microscopic characteristics and colors of the control and Cr-coated samples are discussed below.

Structural Characteristics

Figure 6A:
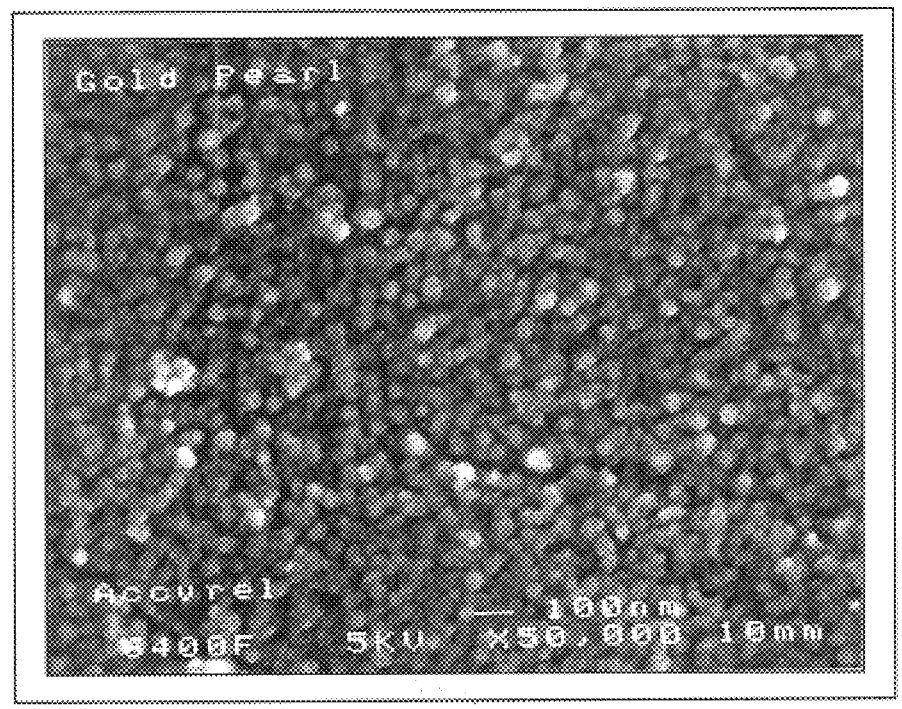
FIG. 6A is a scanning electron microscopic picture at 50000× of the surface of Gold Pearl pigment prior to Cr-deposition according to the invention.
Figure 6B:
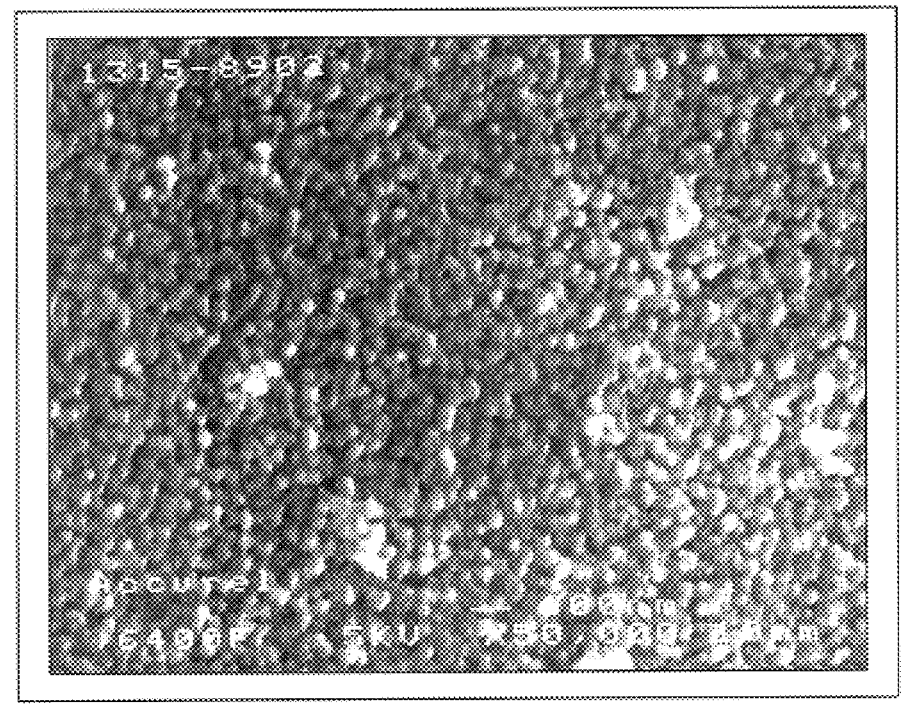
FIG. 6B is a scanning electron microscopic picture at 50000× of the surface of Cr-coated Gold Pearl pigment according to the invention.
Figure 7A:
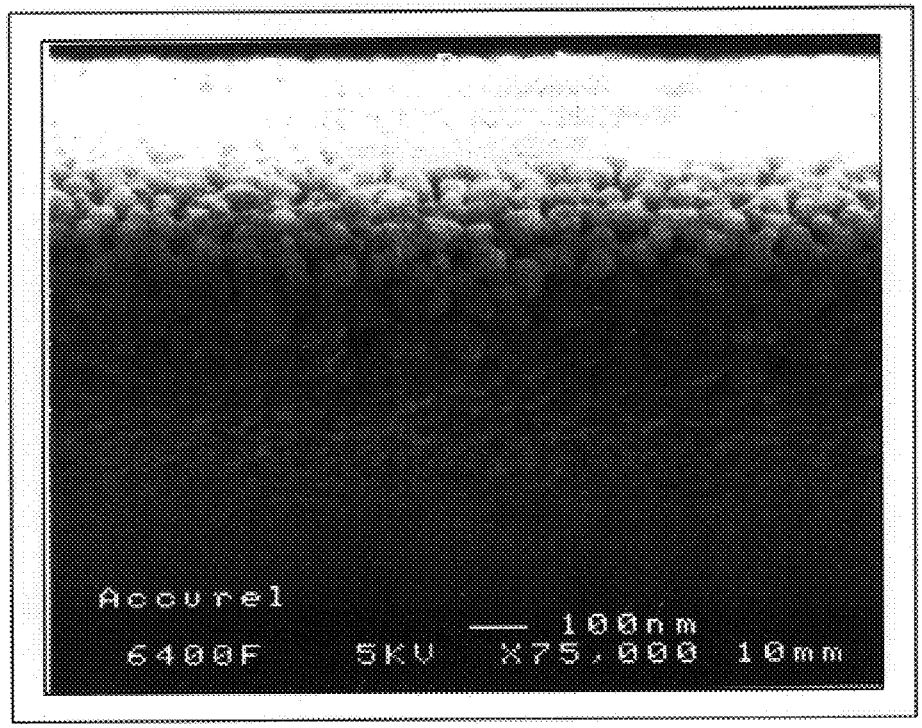
FIG. 7A is a scanning electron microscopic picture at 75000× of the surface of Super Green Pearl pigment prior to Cr-deposition according to the invention.
Figure 7B:
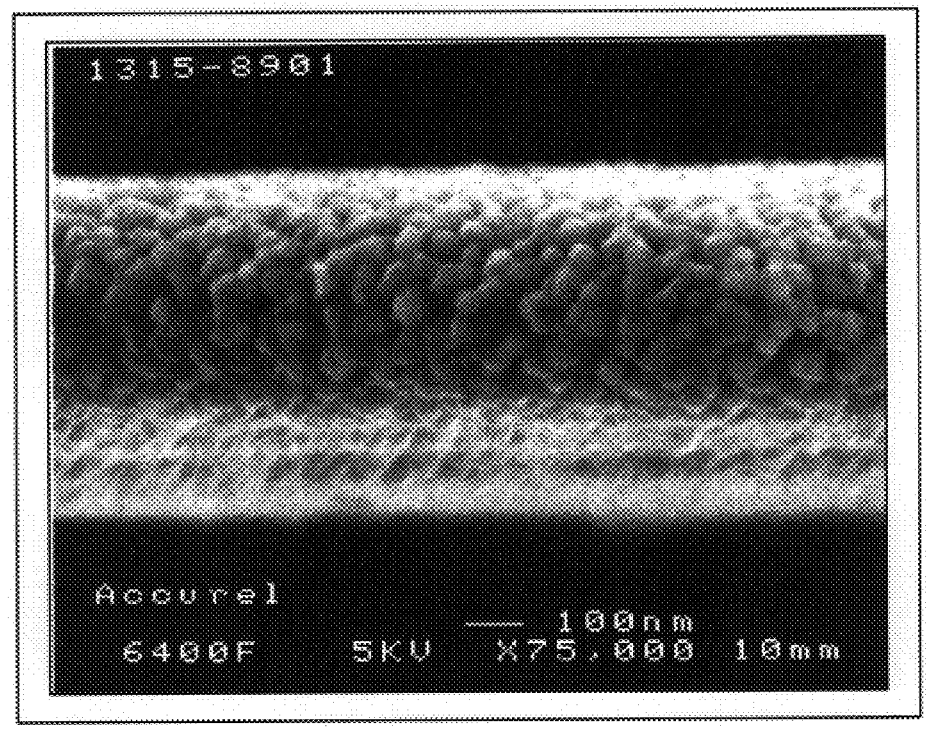
FIG. 7B is a scanning electron microscopic picture at 75000× of the surface of Cr-coated Super Green Pearl pigment according to the invention.
Figure 7C:
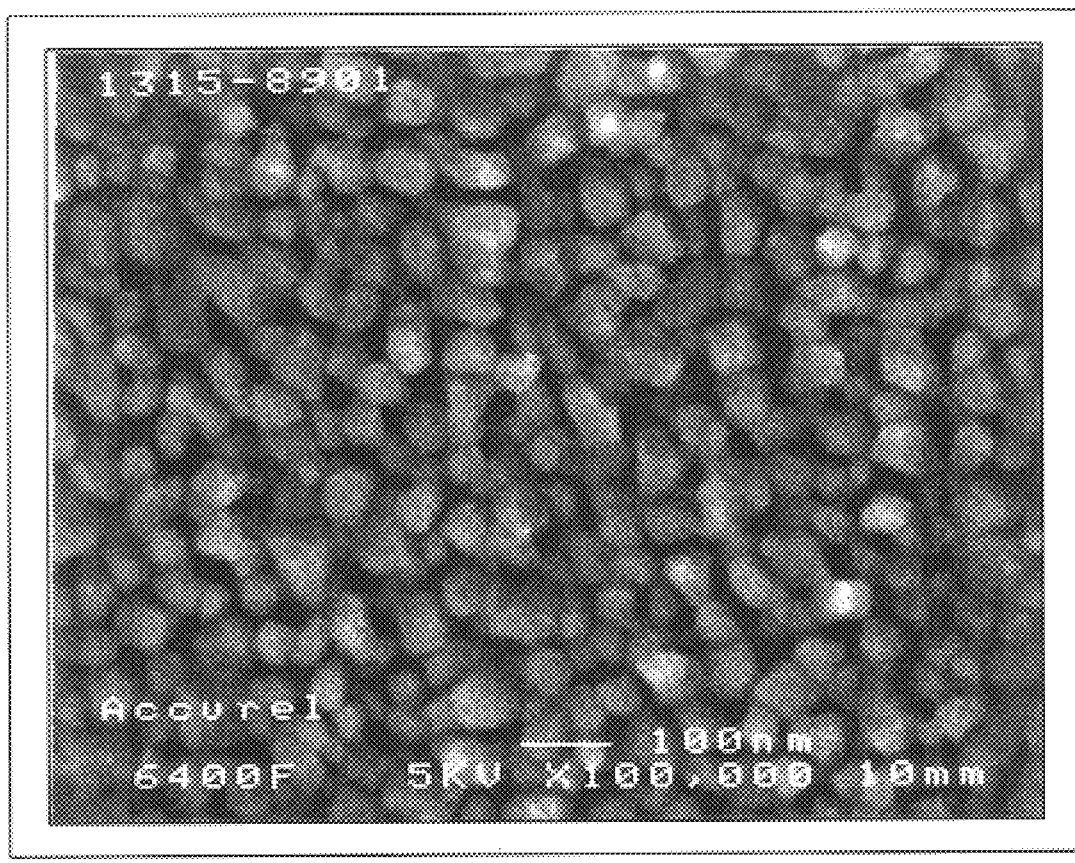
FIG. 7C is a scanning electron microscopic picture at 100000× of the surface of Cr-coated Super Green Pearl pigment according to the invention.

FIGS. 6A–6B, and 7A–7C show scanning electron microscopic pictures of sprayed control pigments and Cr-coated pigments according to this invention. FIGS. 6A and 7A show scanning electron microscopic pictures of the surfaces of control Gold Pearl pigment at 50000× and control Super Green Pearl pigment at 75000×, respectively. FIGS. 6B and 7B show, respectively, scanning electron microscopic pictures of the surface at 50000× of the chromium-coated Gold Pearl pigment in Example 1, and of the surface at 75000× of the chromium-coated Super Green Pearl in Example 2. In addition, FIG. 7C shows a scanning electron microscopic picture of the surface at 10000× of Super Green Pearl pigment that was coated with Cr as described in Example 2.

Comparison of the picture shown in FIG. 6A with that shown in FIG. 6B reveals that the coating with Cr according to this invention has simply replicated the underlying structure of the $TiO_2$ at 50000× magnification. Similarly, comparison of the picture shown in FIG. 7A with that shown in FIG. 7B reveals that, even at the 75000× magnification level, the coating with Cr according to this invention has simply replicated the underlying structure of the $TiO_2$. FIG. 7C shows that no islands or rod-like particles of Cr are visible at the 100000× magnification level of the Cr-coated pigment according to this invention. Instead, the structure at this level of magnification still appears as that of the underlying $TiO_2$ layer. Thus, a snow-ball structure of $TiO_2$ clusters is observed in all the scanning electron microscopy pictures of the control and Cr-coated pigments according to this invention.

In contrast, the photograph shown in U.S. Pat. No. 5,116,664 (the "'664 patent"), where the metal has been deposited by electroless methods, reveals the existence of finely divided rod-like particles (see also col. 6, line 16 in the '664 patent). The magnification at which the photograph in the '664 patent is shown is 72000×, whereas not even the photograph shown in FIG. 7C, taken at 100000×, for the Cr-coated pigment according to this invention shows the presence of any type of formation other than the uniform coating of the $TiO_2$ layer. In particular, no scanning electron microscopic picture of the chromium-coated surface according to this invention shows any rod-like formation or island. Instead, the pictures in FIGS. 6B, 7B, and 7C show a smooth replication of the structure of the $TiO_2$ layer by the coating of chromium.

Optical Properties

Compared to the control samples, the chromium coated pigments in some samples exhibited a higher chroma, a higher dynamic color shift, and a higher hiding power. Hue changes, i.e., color changes, were also noted.

The higher hiding power was readily seen by comparing spray out samples on white paper panels. Under visual inspection, the control samples on the white paper background showed a slight reflection in color at near normal angle, but at a glancing angle the white paper was readily visible. On black paper, the control showed little difference in reflection at normal versus glancing angle, i.e., the colors were practically the same. In contrast, the chromium-coated pigment showed little, if any, difference in color whether it was sprayed over a black or white background. The pigment itself was also notably different. The control pigment was whitish in color whereas the Cr-coated pigment was colored.

Upon visual inspection, the control samples on a white background only showed reflected color at near normal incidence. At higher angles, only the mass tone of the white background is seen. In contrast, the treated Cr-coated interference mica showed the color of the pigment at all angles. This observation implies a much improved hiding power (hiding the background color) over the control samples.

Table 1 shows the difference between the color parameters for the control pigments on white and on black paper panels versus the Cr-coated pigments also on white and on black paper panels for the samples in Examples 1–3. The $L^*a^*b^*$ coordinates were measured at 10° incidence with a $D_{65}$ illuminant (CIE illuminant with a color temperature of 6504 K) with a Data Color 600 color integrating measuring instrument. DCA™ calculations were based on color measurements using off-gloss (i.e., specular) geometry on a Zeiss GK 311M spectrophotometer. As described hereinabove, DCA™ is a measure of the color gamut available as the angle of viewing is changed.

TABLE 1

Color Properties of Coated and Un-Coated Interference Mica

| Sample | Background | DCA | L* | a* | b* | C* | h |
|---|---|---|---|---|---|---|---|
| Gold Pearl | White | 49.4 | 90.6 | −2.3 | 15.2 | 15.4 | 98.6 |
| Gold Pearl + Cr | White | 128.9 | 71.0 | 1.4 | 21.3 | 21.3 | 86.0 |
| Gold Pearl | Black | 89.1 | 76.8 | −1.0 | 24.6 | 24.9 | 92.2 |
| Gold Pearl + Cr | Black | 130.9 | 66.5 | 1.72 | 25.5 | 25.6 | 86.2 |
| Super Green | White | 223.8 | 89.2 | −5.17 | 13.3 | 14.3 | 111.2 |
| Super Green + Cr | White | 487.3 | 67.7 | −11.8 | 14.6 | 18.8 | 129.0 |
| Super Green | Black | 380.6 | 75.1 | −15.3 | 10.0 | 18.25 | 146.8 |
| Super Green + Cr | Black | 534.9 | 65.1 | −14.7 | 15.0 | 21.0 | 134.5 |
| Violet Pearl | White | 232.2 | 91.4 | −0.77 | 5.74 | 5.79 | 97.7 |
| Violet Pearl + Cr | White | 523.8 | 50.9 | 8.1 | −16.0 | 17.9 | 296.6 |
| Violet Pearl | Black | 982.5 | 47.5 | 20.0 | −27.7 | 34.2 | 305.8 |
| Violet Pearl + Cr | Black | 716.9 | 43.9 | 10.7 | −24.0 | 26.3 | 294.1 |

The DCA™ values in Table 1 for the Cr-coated pigments are greater than the corresponding values for the control samples by a factor in the range of approximately 1.4–2.6. This means that the available color gamut for the Cr-coated pigments has been increased by the same factor. As shown in Table 1, the DCA™ value for the Violet Pearl+Cr on a black background is lower than the corresponding value for the uncoated Violet Pearl (control). This observation is explained in terms of an excess of deposited chromium, which results in lower chroma because it moves the color saturation towards the achromatic point at $(a^*, b^*)=(0, 0)$, the origin. This lower chroma decreases the DCA™ value. The chroma for the Violet Pearl+Cr is still higher than the chroma for the control with no chromium on the white background because the chroma for the control on a white background is initially very low. Generally, as chromium is being added, the chroma and DCA™ values will increase, but with additional chromium deposition the chroma and DCA™ values will ultimately decrease as the pigment behaves more like chromium powder. The intensification of chroma with the added layer of chromium is due to an increase in absorption and interference effects.

Example 9

Figure 8:
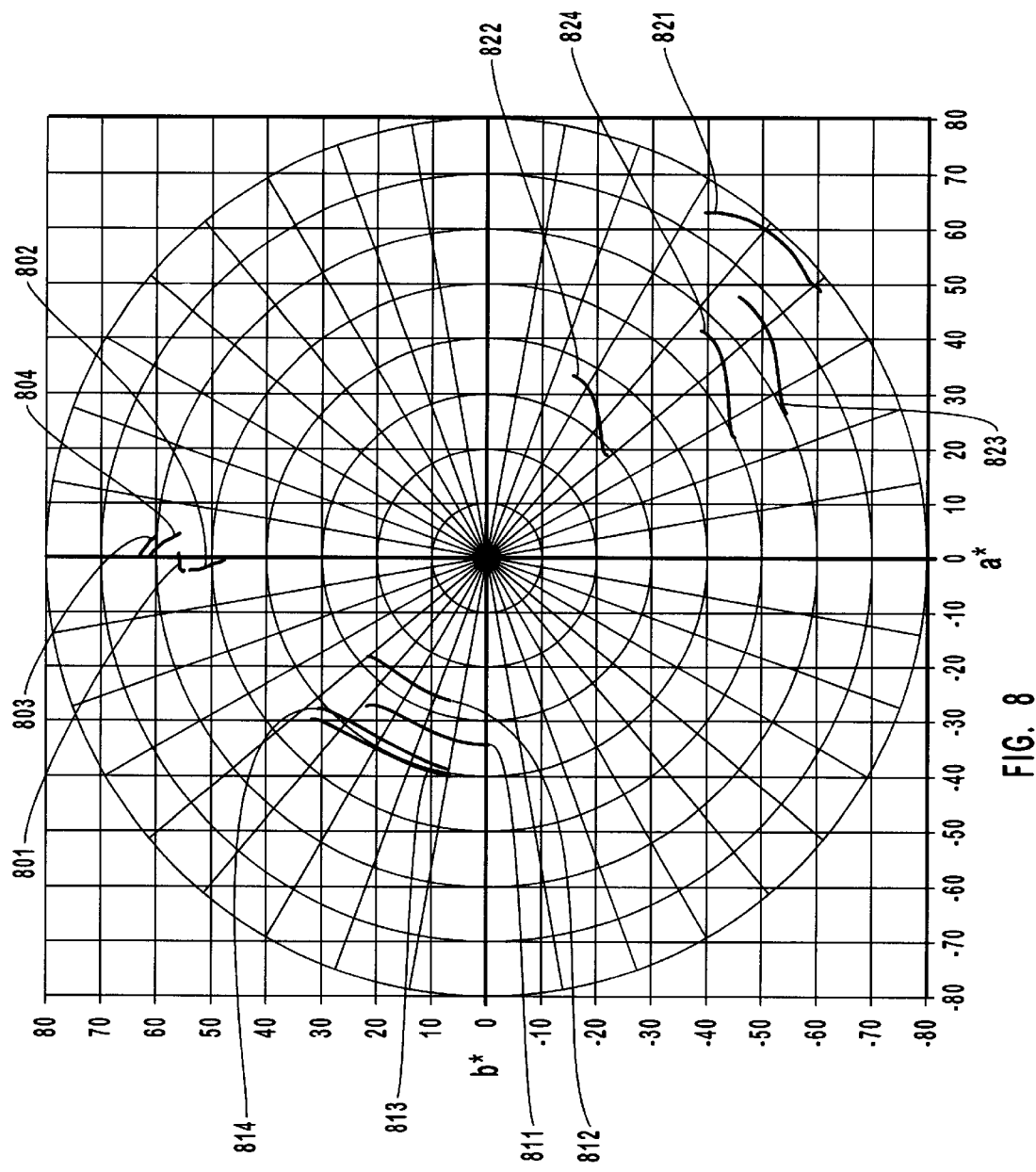
FIG. 8 is a plot in a*b* color space showing the hue and chroma changes for three pigments upon Cr-coating according to the invention.

Further color characterization using $D_{65}$ illumination was performed with a Zeiss spectrophotometer to show the color at various viewing angles; the measurements were also taken just off-gloss conditions. FIG. 8 is a plot in a*b* color space that shows the hue and chroma changes for the three DuPont pigments in Examples 1–3 as the viewing angles change. For all the pigments whose chroma and hue are plotted in FIG. 8, the Cr-coated pigment as sprayed with the binder on white background has higher chroma than the corresponding control sample as similarly sprayed with the binder on white background. This is shown in FIG. 8 by the location of the chroma point loci for the Cr-coated pigments and those for the corresponding control samples. The chroma point loci for the Cr-coated pigments are farther from the center of the a*b* axis system than point loci for the corresponding control samples. This is also satisfied for the chroma point loci when the background is black for the pigments in Examples 1 and 2.

More specifically, the loci of chroma points 802 and 804 in FIG. 8 correspond to the Gold Pearl interference pigment in Example 1 on white background in the form of control sample and with Cr-coating according to this invention, respectively. Similarly, the loci of chroma points 812, 814 and 822, 824 correspond to the pigments Super Green Pearl in Example 2 and Violet Pearl in Example 3, respectively. The loci 812 and 822 are for the control samples on a white background and the loci 814 and 824 are for the Cr-coated pigments also on white background. The pair of loci chroma points 812, 814 is for the pigment in Example 2 and the pair of chroma points 822, 824 is for the pigment in Example 3. The sets of loci of chroma points 804, 814 and 824 for the Cr-coated pigments on white background are farther from the origin of the a*b* coordinate system than the respective counterparts 802, 812 and 822 for the control samples on white background. In addition, the sets of loci of chroma points 803 and 813 for the Cr-coated pigments on black background in Examples 1 and 2 are also farther from the origin of the a*b* coordinate system than the respective counterparts 801 and 811 for the control samples on black background. These observations are consistent with the changes in chroma values (C* values) given in Table 1 for one measurement at 10°.

Example 10

Color measurements of the spray out paper panels were made on both the white and black backgrounds for both Cr-coated and control $TiO_2$-coated interference mica with a Zeiss color measuring instrument set-up for multi-angle geometry. Data obtained with these measurements are given in Tables 2–29. Samples were illuminated at 45° and 130° (second column in each one of Tables 2–29), and measured at five angles relative to the gloss angle using $D_{65}$ illumination. These angles were 15°, 25°, 45°, 65° and 105° (given in the fourth column in each one of Tables 2–29), and numbered with ordinal numbers in the first column of each one of Tables 2–29. The entries in each of the second columns in these tables are the angles of illumination. For each angle of illumination, the angle of detection is listed in the third column under the heading "View". The gloss angle is the angle for which the angle of incidence is equal to the angle of reflection, and the difference between the gloss angle and the angle of detection is the angle listed in the fourth column under the heading "Diff." for each measurement. The fifth column in each table under the heading "Filt." provides the neutral density filter setting, where unity means that no filter was used. These Tables provide numerical values for the CIE color coordinates a*, b*, L*, C*, and h for the different control and Cr-coated pigments on white and on black backgrounds.

TABLE 2

Figure 9:
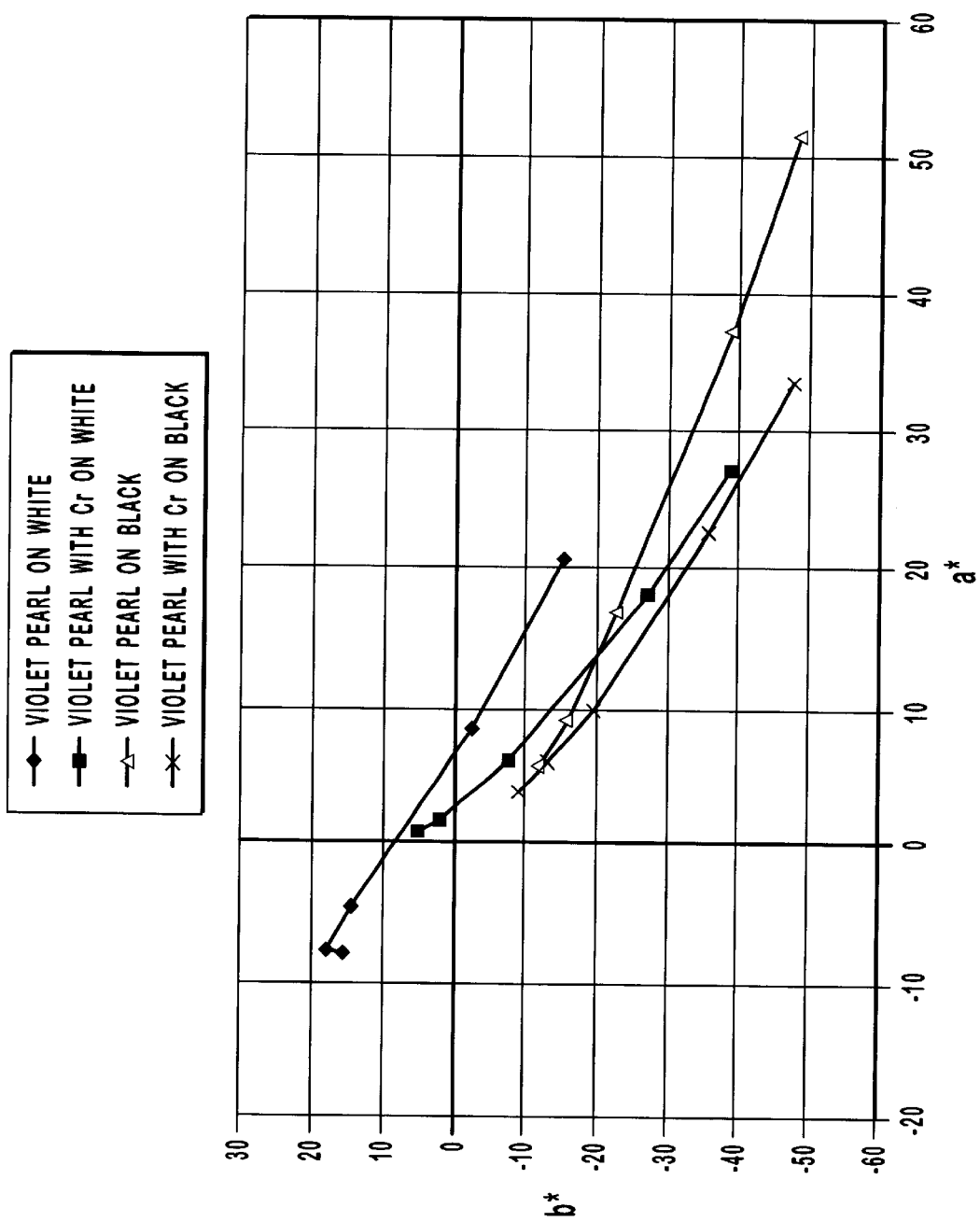
FIG. 9 is a plot in a*b* color space of color coordinates for the pigment Violet Pearl on two background materials upon Cr-coating according to the invention.

Sample: Control Violet Pearl in Example 3 on white background. Points (a*, b*) in this Table correspond to filled diamonds in FIG. 9.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 64.04 | 71.43 | 58.18 | 87.69 | −8.25 | 15.71 | 17.75 | 117.71 |
| 2 | 45 | 70 | 65 | 1 | 64.74 | 72.07 | 56.27 | 88.00 | −8.00 | 18.05 | 19.74 | 113.91 |
| 3 | 45 | 90 | 45 | 1 | 69.25 | 75.39 | 63.20 | 89.57 | −4.77 | 14.40 | 15.17 | 108.33 |
| 4 | 45 | 110 | 25 | 1 | 90.05 | 90.29 | 101.01 | 96.12 | 8.22 | −2.68 | 8.65 | 341.93 |
| 5 | 45 | 120 | 15 | 1 | 112.77 | 105.66 | 141.13 | 102.15 | 20.51 | −15.40 | 25.65 | 323.11 |

TABLE 3

Sample: Control Violet Pearl in Example 3 on black background. Points (a*, b*) in this Table correspond to triangles in FIG. 9.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 5.41 | 5.22 | 8.73 | 27.36 | 5.60 | −11.88 | 13.13 | 295.21 |
| 2 | 45 | 70 | 65 | 1 | 6.05 | 5.56 | 10.54 | 28.28 | 8.91 | −15.92 | 18.25 | 299.22 |
| 3 | 45 | 90 | 45 | 1 | 10.30 | 8.73 | 18.60 | 35.46 | 16.77 | −22.79 | 28.30 | 306.34 |
| 4 | 45 | 110 | 25 | 1 | 31.63 | 23.70 | 57.78 | 55.79 | 37.34 | −38.93 | 53.94 | 313.81 |
| 5 | 45 | 120 | 15 | 1 | 57.92 | 41.42 | 103.57 | 70.47 | 51.57 | −48.55 | 70.83 | 316.72 |

TABLE 4

Sample: Cr-coated Violet Pearl in Example 3 on white background. Points (a*, b*) in this Table correspond to filled squares in FIG. 9.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 6.68 | 6.96 | 6.23 | 31.71 | 0.83 | 4.83 | 4.90 | 80.29 |
| 2 | 45 | 70 | 65 | 1 | 8.31 | 8.58 | 8.63 | 35.17 | 1.58 | 1.92 | 2.49 | 50.49 |
| 3 | 45 | 90 | 45 | 1 | 11.62 | 11.41 | 15.43 | 40.26 | 5.85 | −7.78 | 9.74 | 306.95 |
| 4 | 45 | 110 | 25 | 1 | 27.63 | 24.64 | 47.96 | 56.72 | 18.05 | −27.52 | 32.91 | 303.26 |
| 5 | 45 | 120 | 15 | 1 | 48.76 | 41.67 | 89.97 | 70.65 | 27.12 | −39.18 | 47.65 | 304.69 |

TABLE 5

Sample: Cr-coated Violet Pearl in Example 3 on black background. Points (a*, b*) in this Table correspond to crosses in FIG. 9.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 1.71 | 1.65 | 2.94 | 13.55 | 3.65 | −9.35 | 10.03 | 291.30 |
| 2 | 45 | 70 | 65 | 1 | 2.72 | 2.56 | 5.06 | 18.17 | 5.82 | −13.31 | 14.53 | 293.62 |
| 3 | 45 | 90 | 45 | 1 | 5.90 | 5.37 | 11.55 | 27.76 | 9.54 | −19.69 | 21.88 | 295.86 |
| 4 | 45 | 110 | 25 | 1 | 23.08 | 19.44 | 46.98 | 51.20 | 22.53 | −35.99 | 42.46 | 302.05 |
| 5 | 45 | 120 | 15 | 1 | 47.23 | 38.27 | 96.72 | 68.22 | 33.35 | −47.97 | 58.42 | 304.81 |

TABLE 6

Figure 10:
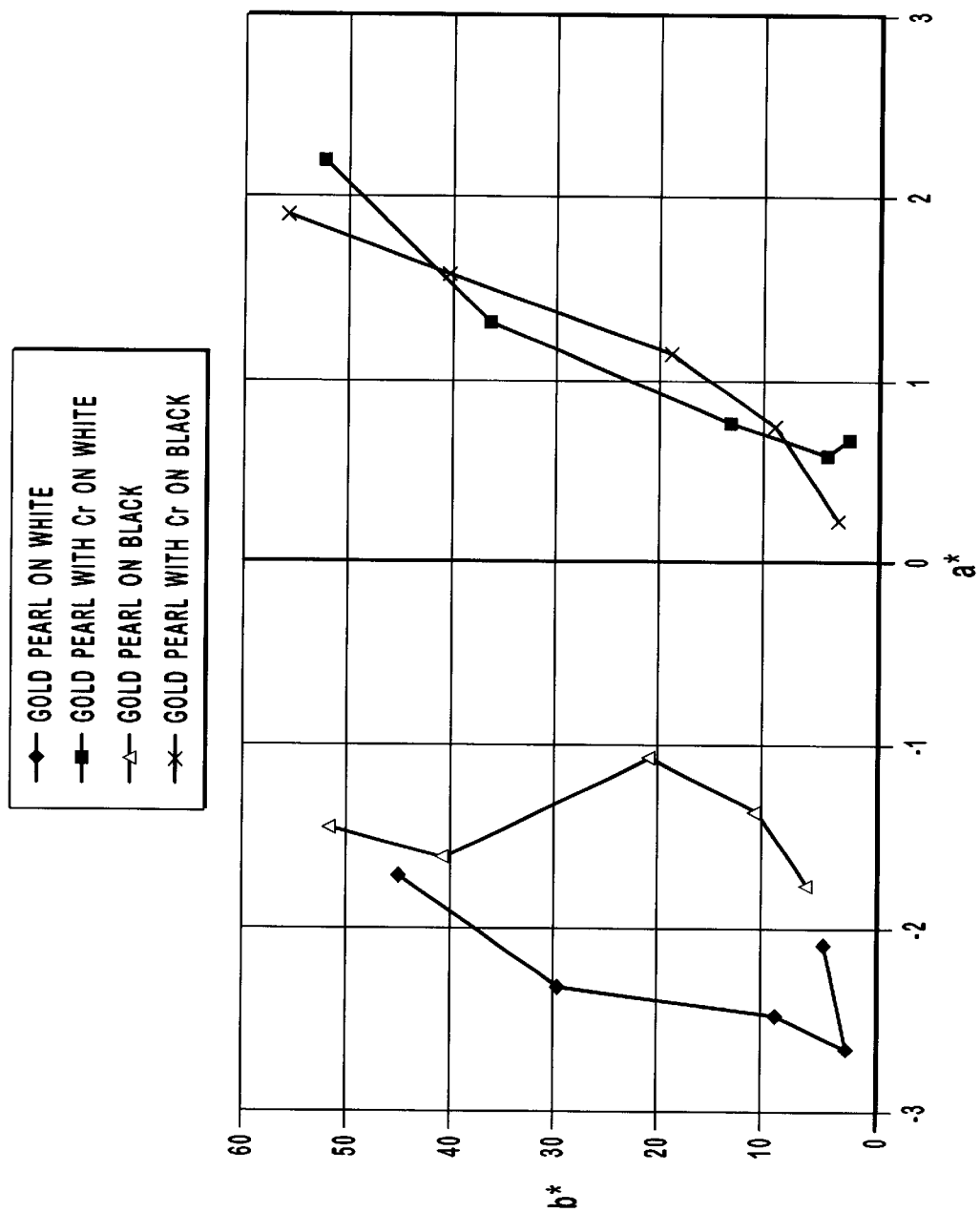
FIG. 10 is a plot in a*b* color space of color coordinates for the pigment Gold Pearl on two background materials upon Cr-coating according to the invention.

Sample: Control Gold Pearl in Example 1 on white background. Points (a*, b*) in this Table correspond to filled diamonds in FIG. 10.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 46.49 | 49.82 | 49.52 | 75.96 | −2.09 | 4.02 | 4.53 | 117.46 |
| 2 | 45 | 70 | 65 | 1 | 45.47 | 48.94 | 50.70 | 75.41 | −2.64 | 1.85 | 3.22 | 144.94 |
| 3 | 45 | 90 | 45 | 1 | 57.64 | 61.87 | 57.03 | 82.84 | −2.47 | 8.43 | 8.79 | 106.31 |
| 4 | 45 | 110 | 25 | 1 | 114.22 | 122.06 | 83.71 | 107.97 | −2.33 | 29.65 | 29.74 | 94.49 |
| 5 | 45 | 120 | 15 | 1 | 180.92 | 192.41 | 113.90 | 128.28 | −1.71 | 44.76 | 44.80 | 92.19 |

TABLE 7

Sample: Control Gold Pearl in Example 1 on black background. Points (a*, b*) in this Table correspond to triangles in FIG. 10.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 17.60 | 18.91 | 17.36 | 50.59 | −1.77 | 5.84 | 6.10 | 106.86 |
| 2 | 45 | 70 | 65 | 1 | 21.13 | 22.59 | 18.50 | 54.65 | −1.37 | 10.51 | 10.60 | 97.43 |
| 3 | 45 | 90 | 45 | 1 | 35.80 | 38.10 | 25.57 | 68.09 | −1.08 | 21.01 | 21.03 | 92.94 |
| 4 | 45 | 110 | 25 | 1 | 90.79 | 96.71 | 51.95 | 98.71 | −1.62 | 40.76 | 40.79 | 92.27 |
| 5 | 45 | 120 | 15 | 1 | 145.09 | 154.20 | 77.74 | 118.02 | −1.47 | 51.45 | 51.47 | 91.63 |

TABLE 8

Sample: Cr-coated Gold Pearl in Example 1 on white background. Points (a*, b*) in this Table correspond to squares in FIG. 10.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 11.74 | 12.28 | 12.56 | 41.66 | 0.67 | 1.59 | 1.73 | 67.04 |
| 2 | 45 | 70 | 65 | 1 | 13.93 | 14.60 | 14.05 | 45.08 | 0.59 | 3.75 | 3.80 | 81.12 |
| 3 | 45 | 90 | 45 | 1 | 22.76 | 23.83 | 18.35 | 55.91 | 0.77 | 12.99 | 13.01 | 86.60 |
| 4 | 45 | 110 | 25 | 1 | 70.08 | 73.27 | 40.14 | 88.58 | 1.31 | 36.22 | 36.24 | 87.92 |
| 5 | 45 | 120 | 15 | 1 | 138.59 | 144.49 | 70.70 | 115.14 | 2.19 | 52.09 | 52.14 | 87.59 |

TABLE 9

Sample: Cr-coated Gold Pearl in Example 1 on black background. Points (a*, b*) in this Table correspond to crosses in FIG. 10.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 5.52 | 5.81 | 5.63 | 28.92 | 0.22 | 2.59 | 2.60 | 85.07 |
| 2 | 45 | 70 | 65 | 1 | 8.28 | 8.65 | 6.83 | 35.30 | 0.76 | 8.61 | 8.64 | 84.97 |
| 3 | 45 | 90 | 45 | 1 | 17.33 | 18.06 | 11.24 | 49.57 | 1.13 | 18.79 | 18.83 | 86.57 |
| 4 | 45 | 110 | 25 | 1 | 65.89 | 68.77 | 34.08 | 86.39 | 1.56 | 40.09 | 40.12 | 87.77 |
| 5 | 45 | 120 | 15 | 1 | 136.62 | 142.66 | 65.35 | 114.59 | 1.89 | 55.64 | 55.67 | 88.06 |

TABLE 10

Figure 11:
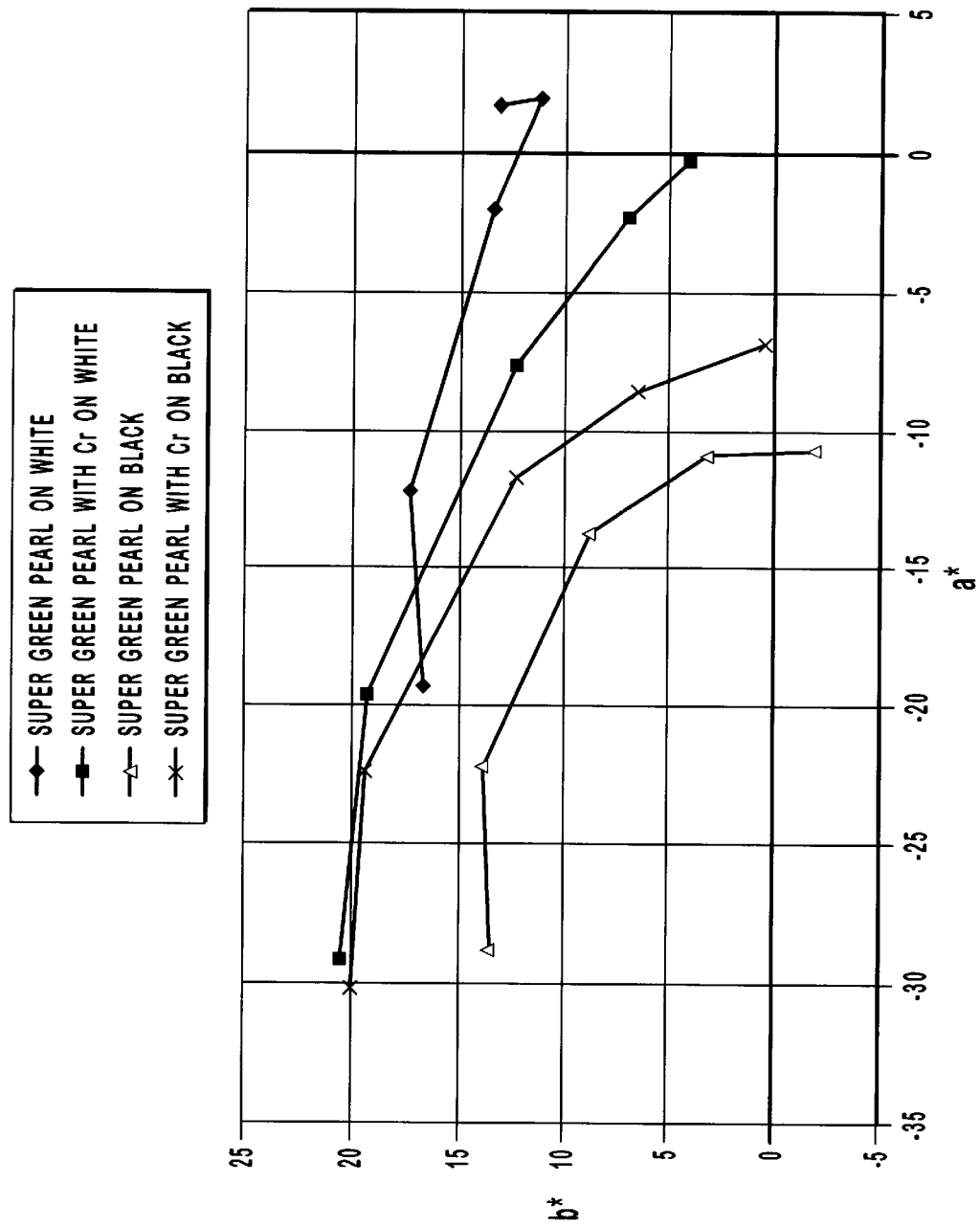
FIG. 11 is a plot in a*b* color space of color coordinates for the pigment Super Green Pearl on two background materials upon Cr-coating according to the invention.

Sample: Control Super Green Pearl in Example 2 on white background. Points (a*, b*) in this Table correspond to filled diamonds in FIG. 11.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 51.50 | 53.66 | 44.77 | 78.27 | 1.65 | 13.10 | 13.20 | 82.81 |
| 2 | 45 | 70 | 65 | 1 | 50.87 | 52.89 | 45.79 | 77.81 | 1.93 | 11.18 | 11.35 | 80.21 |
| 3 | 45 | 90 | 45 | 1 | 61.31 | 65.59 | 55.37 | 84.79 | −2.05 | 13.37 | 13.53 | 98.71 |
| 4 | 45 | 110 | 25 | 1 | 96087 | 109.82 | 90.76 | 103.68 | −12.26 | 17.22 | 21.14 | 125.44 |
| 5 | 45 | 120 | 15 | 1 | 126.91 | 148.45 | 126.98 | 116.33 | −19.33 | 16.63 | 25.50 | 139.31 |

TABLE 11

Sample: Control Super Green Pearl in Example 2 on black background. Points (a*, b*) in this Table correspond to triangles in FIG. 11.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 16.33 | 19.30 | 21.82 | 51.03 | −10.71 | −2.03 | 10.90 | 190.73 |
| 2 | 45 | 70 | 65 | 1 | 20.17 | 23.69 | 23.53 | 55.78 | −10.91 | 3.16 | 11.36 | 163.82 |
| 3 | 45 | 90 | 45 | 1 | 31.55 | 37.42 | 33.25 | 67.59 | −13.80 | 8.80 | 16.37 | 147.49 |
| 4 | 45 | 110 | 25 | 1 | 68.29 | 83.30 | 71.08 | 93.14 | −22.26 | 13.86 | 26.22 | 148.10 |
| 5 | 45 | 120 | 15 | 1 | 100.44 | 124.95 | 110.37 | 108.94 | −28.83 | 13.55 | 31.85 | 154.83 |

TABLE 12

Sample: Cr-coated Super Green Pearl in Example 2 on white background. Points (a*, b*) in this Table correspond to squares in FIG. 11.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 8.83 | 9.35 | 8.78 | 36.65 | −0.32 | 3.96 | 3.97 | 94.67 |
| 2 | 45 | 70 | 65 | 1 | 11.65 | 12.64 | 10.99 | 42.21 | −2.34 | 6.80 | 7.19 | 109.03 |
| 3 | 45 | 90 | 45 | 1 | 19.40 | 22.09 | 17.22 | 54.12 | −7.61 | 12.22 | 14.39 | 121.90 |
| 4 | 45 | 110 | 25 | 1 | 53.75 | 65.16 | 49.14 | 84.57 | −19.65 | 19.25 | 27.51 | 135.59 |
| 5 | 45 | 120 | 15 | 1 | 94.25 | 117.89 | 93.15 | 106.54 | −29.17 | 20.51 | 35.66 | 144.89 |

TABLE 13

Sample: Cr-coated Super Green Pearl in Example 2 on black background. Points (a*, b*) in this Table correspond to crosses in FIG. 11.

| N° | Illum | View | Diff. | Filt. | X | Y | Z | L* | a* | b* | C* | h |
|---|---|---|---|---|---|---|---|---|---|---|---|---|
| 1 | 130 | 155 | −105 | 1 | 4.70 | 5.54 | 5.85 | 28.21 | −6.85 | 0.42 | 6.87 | 176.51 |
| 2 | 45 | 70 | 65 | 1 | 7.68 | 9.10 | 7.84 | 36.17 | −8.54 | 6.37 | 10.65 | 143.30 |
| 3 | 45 | 90 | 45 | 1 | 15.60 | 18.66 | 14.25 | 50.28 | −11.70 | 12.26 | 16.95 | 133.65 |
| 4 | 45 | 110 | 25 | 1 | 49.73 | 61.69 | 46.12 | 82.75 | −22.43 | 19.35 | 29.62 | 139.22 |
| 5 | 45 | 120 | 15 | 1 | 87.73 | 110.80 | 87.67 | 104.04 | −30.16 | 20.01 | 36.19 | 146.44 |

TABLE 14

Figure 12:
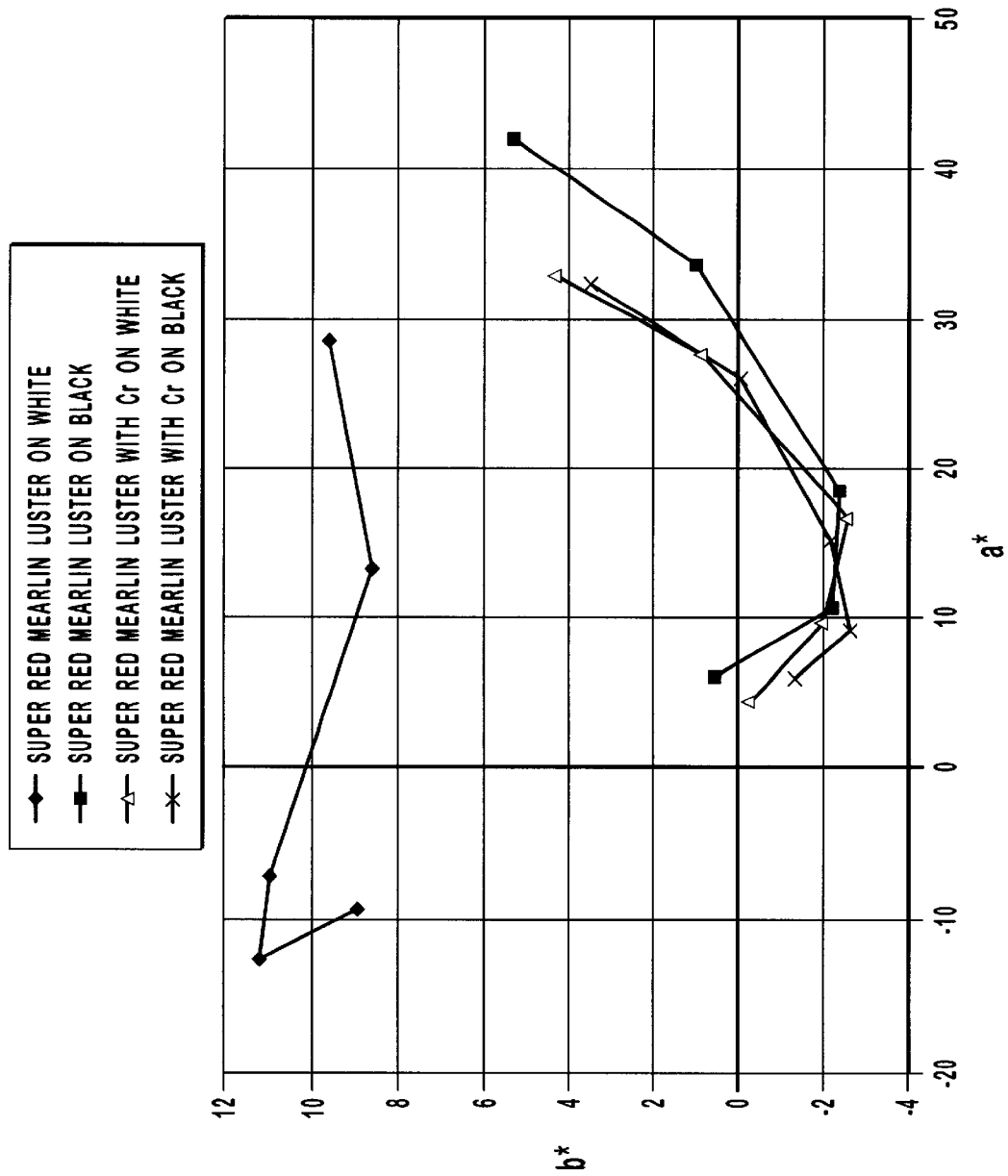
FIG. 12 is a plot in a*b* color space of color coordinates for the pigment Super Red Mearlin Luster on two background materials upon Cr-coating according to the invention.

Sample: Control Super Red Merlin Luster in Example 7 on white background. Points (a*, b*) in this Table correspond to filled diamonds in FIG. 12.

| N° | Illum | View | Diff. | Filt. | X | Y | Z | L* | a* | b* | C* | h |
|---|---|---|---|---|---|---|---|---|---|---|---|---|
| 1 | 45 | 70 | 65 | 1 | 58.75 | 67.62 | 59.57 | 85.82 | −12.58 | 11.19 | 16.84 | 138.35 |
| 2 | 45 | 90 | 45 | 1 | 67.88 | 75.06 | 66.88 | 89.42 | −7.11 | 10.94 | 13.05 | 123.02 |
| 3 | 45 | 110 | 25 | 1 | 110.03 | 107.50 | 101.56 | 102.83 | 13.25 | 8.54 | 15.76 | 32.80 |
| 4 | 45 | 120 | 15 | 1 | 161.72 | 147.23 | 139.02 | 115.96 | 28.60 | 9.52 | 30.14 | 18.41 |
| 5 | 130 | 155 | −105 | 1 | 57.08 | 64.28 | 58.83 | 84.11 | −9.32 | 8.93 | 12.91 | 136.21 |

TABLE 15

Sample: Control Super Red Merlin Luster in Example 7 on black background. Points (a*, b*) in this Table correspond to squares in FIG. 12.

| N° | Illum | View | Diff. | Filt. | X | Y | Z | L* | a* | b* | C* | h |
|---|---|---|---|---|---|---|---|---|---|---|---|---|
| 1 | 45 | 70 | 65 | 1 | 13.32 | 12.39 | 14.23 | 41.83 | 10.66 | −2.27 | 10.90 | 347.99 |
| 2 | 45 | 90 | 45 | 1 | 21.45 | 18.76 | 21.45 | 50.41 | 18.45 | −2.43 | 18.60 | 352.49 |
| 3 | 45 | 110 | 25 | 1 | 56.05 | 46.02 | 48.55 | 73.56 | 33.63 | 0.88 | 33.64 | 1.50 |
| 4 | 45 | 120 | 15 | 1 | 93.99 | 76.13 | 74.93 | 89.92 | 42.01 | 5.20 | 42.33 | 7.06 |
| 5 | 130 | 155 | −105 | 1 | 12.41 | 12.19 | 12.89 | 41.51 | 5.98 | 0.49 | 6.00 | 4.69 |

TABLE 16

Sample: Cr-coated Super Red Merlin Luster in Example 7 on white background Points (a*, b*) in this Table correspond to triangles in FIG. 12.

| N° | Illum | View | Diff. | Filt. | X | Y | Z | L* | a* | b* | C* | h |
|---|---|---|---|---|---|---|---|---|---|---|---|---|
| 1 | 45 | 70 | 65 | 1 | 8.98 | 8.32 | 9.56 | 34.63 | 9.66 | −2.02 | 9.87 | 348.19 |
| 2 | 45 | 90 | 45 | 1 | 17.49 | 15.40 | 17.76 | 46.18 | 16.61 | −2.58 | 16.81 | 351.17 |
| 3 | 45 | 110 | 25 | 1 | 48.18 | 40.98 | 43.30 | 70.16 | 27.61 | 0.78 | 27.63 | 1.61 |
| 4 | 45 | 120 | 15 | 1 | 77.12 | 65.35 | 65.13 | 84.66 | 32.84 | 4.24 | 33.11 | 7.35 |
| 5 | 130 | 155 | −105 | 1 | 5.26 | 5.18 | 5.63 | 27.25 | 4.32 | −0.30 | 4.34 | 355.98 |

TABLE 17

Sample: Cr-coated Super Red Merlin Luster in Example 7 on black background. Points (a*, b*) in this Table correspond to crosses in FIG. 12.

| N° | Illum | View | Diff. | Filt. | X | Y | Z | L* | a* | b* | C* | h |
|---|---|---|---|---|---|---|---|---|---|---|---|---|
| 1 | 45 | 70 | 65 | 1 | 7.38 | 6.83 | 8.07 | 31.41 | 9.15 | −2.68 | 9.53 | 343.70 |
| 2 | 45 | 90 | 45 | 1 | 14.03 | 12.41 | 14.25 | 41.86 | 15.07 | −2.26 | 15.24 | 351.47 |
| 3 | 45 | 110 | 25 | 1 | 39.74 | 33.77 | 36.38 | 64.78 | 26.01 | −0.17 | 26.01 | 359.63 |
| 4 | 45 | 120 | 15 | 1 | 69.38 | 58.53 | 59.11 | 81.03 | 32.32 | 3.36 | 32.49 | 5.94 |
| 5 | 130 | 155 | −105 | 1 | 5.21 | 5.00 | 5.67 | 26.72 | 5.90 | −1.40 | 6.06 | 346.65 |

TABLE 18

Figure 13:
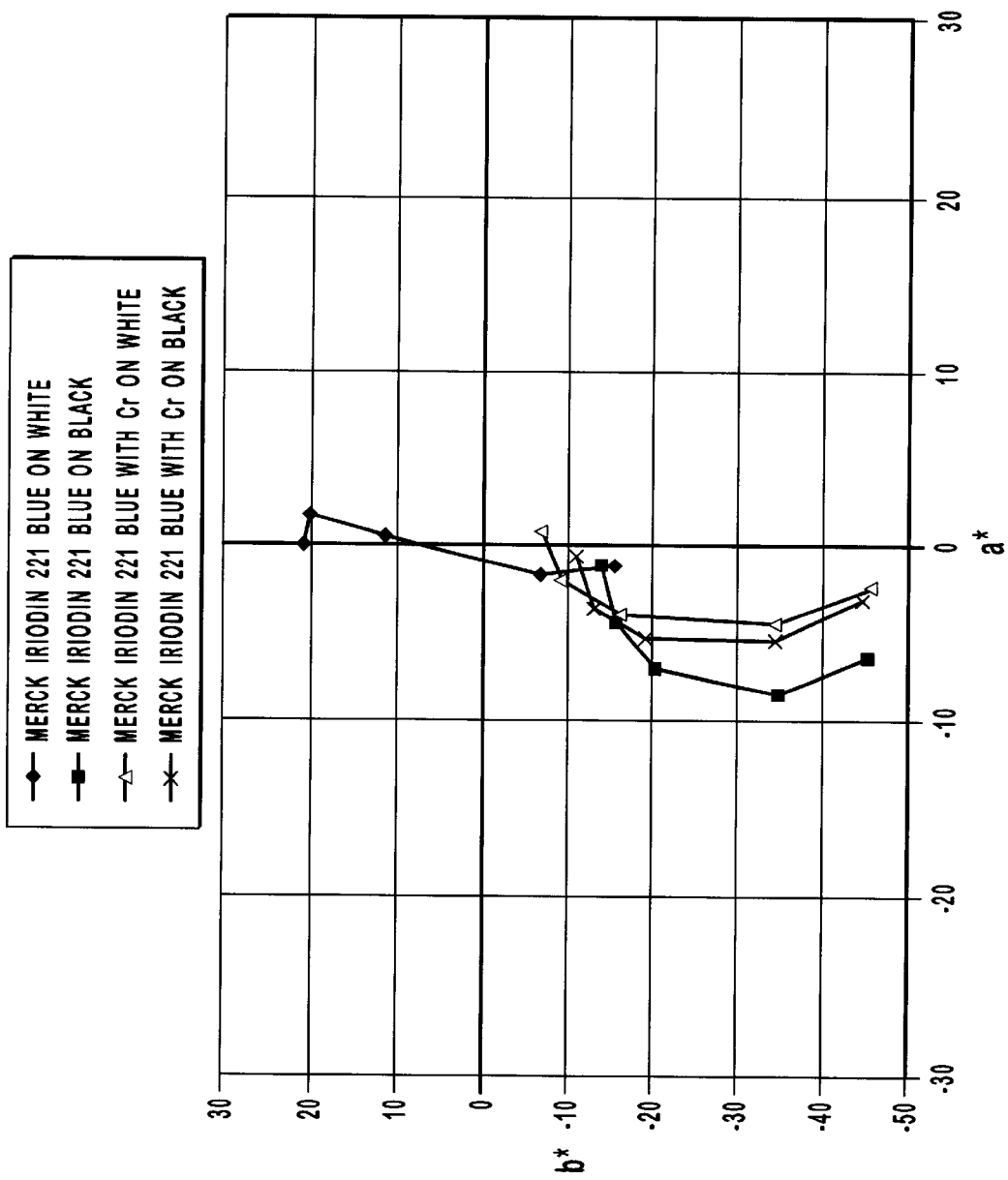
FIG. 13 is a plot in a*b* color space of color coordinates for the pigment Merck Iriodin® 221 Blue on two background materials upon Cr-coating according to the invention.

Sample: Control Merck Iriodin ® 221 Blue in Example 4 on white background. Points (a*, b*) in this Table correspond to filled diamonds in FIG. 13.

| N° | Illum | View | Diff. | Filt. | X | Y | Z | L* | a* | b* | C* | h |
|---|---|---|---|---|---|---|---|---|---|---|---|---|
| 1 | 45 | 70 | 65 | 1 | 69.83 | 72.82 | 54.97 | 88.36 | 1.70 | 19.92 | 20.00 | 85.11 |
| 2 | 45 | 90 | 45 | 1 | 75.52 | 79.43 | 70.94 | 91.43 | 0.44 | 11.01 | 11.02 | 87.70 |
| 3 | 45 | 110 | 25 | 1 | 88.45 | 94.28 | 112.60 | 97.75 | −1.71 | −7.10 | 7.31 | 256.43 |
| 4 | 45 | 120 | 15 | 1 | 95.35 | 101.31 | 137.08 | 100.50 | −1.23 | −16.12 | 16.16 | 265.64 |
| 5 | 130 | 155 | −105 | 1 | 63.75 | 67.23 | 49.57 | 85.62 | 0.02 | 20.62 | 20.62 | 89.95 |

TABLE 19

Sample: Control Merck Iriodin ® 221 Blue in Example 4 on black background. Points (a*, b*) in this Table correspond to squares in FIG. 13.

| N° | Illum | View | Diff. | Filt. | X | Y | Z | L* | a* | b* | C* | h |
|---|---|---|---|---|---|---|---|---|---|---|---|---|
| 1 | 45 | 70 | 65 | 1 | 18.59 | 20.53 | 32.40 | 52.43 | −4.48 | −16.17 | 16.78 | 254.52 |
| 2 | 45 | 90 | 45 | 1 | 22.40 | 25.28 | 42.96 | 57.35 | −7.04 | −20.93 | 22.08 | 251.40 |
| 3 | 45 | 110 | 25 | 1 | 35.00 | 39.58 | 81.09 | 69.17 | −8.44 | −35.30 | 36.30 | 256.56 |
| 4 | 45 | 120 | 15 | 1 | 45.35 | 50.24 | 115.12 | 76.22 | −6.46 | −45.72 | 46.18 | 261.96 |
| 5 | 130 | 155 | −105 | 1 | 19.02 | 20.31 | 30.82 | 52.19 | −1.20 | −14.38 | 14.43 | 265.24 |

TABLE 20

Sample: Cr-coated Merck Iriodin ® 221 Blue in Example 4 on white background. Points (a*, b*) in this Table correspond to triangles in FIG. 13.

| N° | Illum | View | Diff. | Filt. | X | Y | Z | L* | a* | b* | C* | h |
|---|---|---|---|---|---|---|---|---|---|---|---|---|
| 1 | 45 | 70 | 65 | 1 | 9.23 | 9.95 | 14.17 | 37.74 | −1.64 | −9.17 | 9.31 | 259.84 |
| 2 | 45 | 90 | 45 | 1 | 14.19 | 15.64 | 25.72 | 46.50 | −3.94 | −16.46 | 16.92 | 256.54 |
| 3 | 45 | 110 | 25 | 1 | 30.97 | 33.98 | 71.26 | 64.94 | −4.56 | −34.91 | 35.21 | 262.56 |
| 4 | 45 | 120 | 15 | 1 | 45.84 | 49.26 | 113.80 | 75.61 | −2.45 | −45.99 | 46.05 | 266.95 |
| 5 | 130 | 155 | −105 | 1 | 7.37 | 7.69 | 10.48 | 33.34 | 0.72 | −7.04 | 7.08 | 275.83 |

TABLE 21

Sample: Cr-coated Merck Iriodin ® 221 Blue in Example 4 on black background. Points (a*, b*) in this Table correspond to crosses in FIG. 13.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 7.49 | 8 31 | 13.71 | 34.63 | −3.67 | −13.43 | 13.92 | 254.71 |
| 2 | 45 | 90 | 45 | 1 | 11.94 | 13.42 | 24.41 | 43.38 | −5.36 | −19.68 | 20.40 | 254.76 |
| 3 | 45 | 110 | 25 | 1 | 27.05 | 29.99 | 64.51 | 61.64 | −5.49 | −34.91 | 35.34 | 261.06 |
| 4 | 45 | 120 | 15 | 1 | 40.30 | 43.59 | 102.10 | 71.95 | −3.16 | −45.05 | 45.16 | 265.99 |
| 5 | 130 | 155 | −105 | 1 | 6.05 | 6.44 | 10.29 | 30.49 | −0.62 | −11.36 | 11.38 | 266.85 |

TABLE 22

Figure 14:
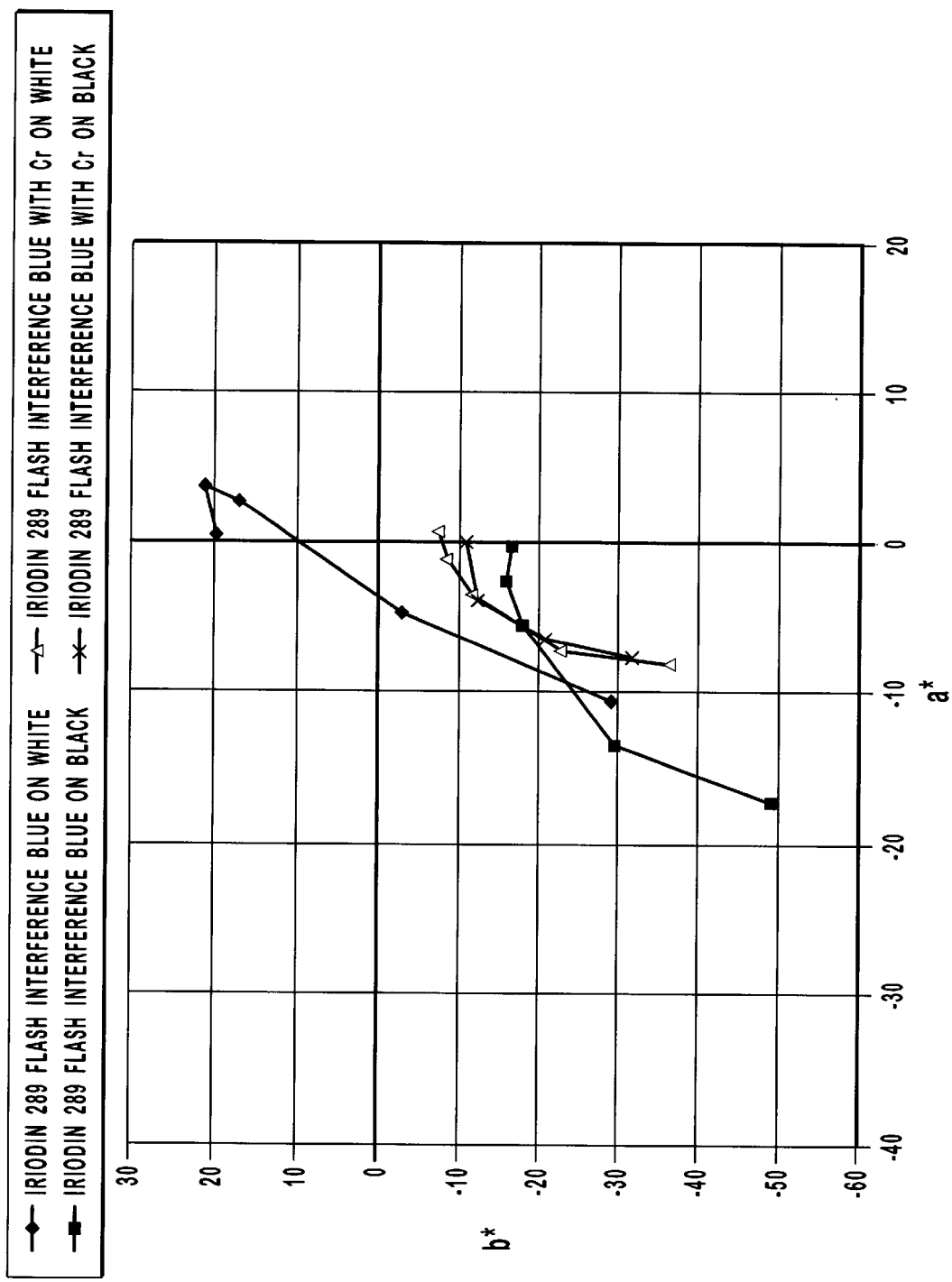
FIG. 14 is a plot in a*b* color space of color coordinates for the pigment Iriodin® 289 Flash Interference Blue on two background materials upon Cr-coating according to the invention.

Sample: Control Iriodin ® Flash Interference Blue in Example 5 on white background. Points (a*, b*) in this Table correspond to filled diamonds in FIG. 14.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 64.02 | 65.80 | 47.85 | 84.90 | 3.77 | 21.18 | 21.51 | 79.91 |
| 2 | 45 | 90 | 45 | 1 | 68.11 | 70.52 | 56.17 | 87.25 | 2.75 | 16.85 | 17.08 | 80.73 |
| 3 | 45 | 110 | 25 | 1 | 90.20 | 97.93 | 110.29 | 99.19 | −4.77 | −3.21 | 5.75 | 213.93 |
| 4 | 45 | 120 | 15 | 1 | 128.74 | 143.80 | 222.82 | 114.93 | −10.68 | −29.39 | 31.27 | 250.02 |
| 5 | 130 | 155 | −105 | 1 | 63.93 | 67.22 | 50.28 | 85.61 | 0.46 | 19.87 | 19.88 | 88.68 |

TABLE 23

Sample: Control Iriodin ® Flash Interference Blue in Example 5 on black background. Points (a*, b*) in this Table correspond lo squares in FIG. 14.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 12.32 | 13.40 | 22.27 | 43.36 | −2.63 | −16.06 | 16.27 | 260.68 |
| 2 | 45 | 90 | 45 | 1 | 15.89 | 17.80 | 29.89 | 49.25 | −5.58 | −18.10 | 18.94 | 252.88 |
| 3 | 45 | 110 | 25 | 1 | 34.88 | 41.12 | 76.30 | 70.26 | −13.54 | −29.76 | 32.70 | 245.53 |
| 4 | 45 | 120 | 15 | 1 | 70.68 | 83.41 | 179.34 | 93.19 | −17.29 | −49.06 | 52.01 | 250.58 |
| 5 | 130 | 155 | −105 | 1 | 12.61 | 13.33 | 22.61 | 43.26 | −0.24 | −16.81 | 16.82 | 269.17 |

TABLE 24

Sample: Cr-coated Iriodin ® Flash Interference Blue in Example 5 on white background. Points (a*, b*) in this Table correspond to triangles in FIG. 14.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 5.30 | 5.70 | 8.42 | 28.64 | −1.20 | −8.64 | 8.72 | 262.12 |
| 2 | 45 | 90 | 45 | 1 | 8.93 | 9.88 | 15.17 | 37.62 | −3.64 | −11.73 | 12.28 | 252.75 |
| 3 | 45 | 110 | 25 | 1 | 29.16 | 32.78 | 55.52 | 63.98 | −7.23 | −22.64 | 23.77 | 252.28 |
| 4 | 45 | 120 | 15 | 1 | 70.04 | 77.93 | 144.18 | 90.75 | −8.14 | −36.62 | 37.51 | 257.47 |
| 5 | 130 | 155 | −105 | 1 | 3.58 | 3.73 | 5.51 | 22.75 | −0.65 | −7.50 | 7.53 | 274.96 |

TABLE 25

Sample: Cr-coated Iriodin ® Flash Interference Blue in Example 5 on black background. Points (a*, b*) in this Table correspond to crosses in FIG. 14.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 4.54 | 4.94 | 7.85 | 26.58 | −1.95 | −10.22 | 10.40 | 259.17 |
| 2 | 45 | 90 | 45 | 1 | 7.72 | 8.59 | 13.73 | 35.18 | −3.92 | −12.52 | 13.12 | 252.61 |
| 3 | 45 | 110 | 25 | 1 | 23.37 | 26.22 | 44.38 | 58.24 | −6.52 | −20.98 | 21.97 | 252.75 |
| 4 | 45 | 120 | 15 | 1 | 52.35 | 58.40 | 105.96 | 80.96 | −7.75 | −31.96 | 32.89 | 256.37 |
| 5 | 130 | 155 | −105 | 1 | 3.31 | 3.49 | 5.81 | 21.89 | 0.02 | −10.31 | 10.31 | 270.13 |

TABLE 26

Figure 15:
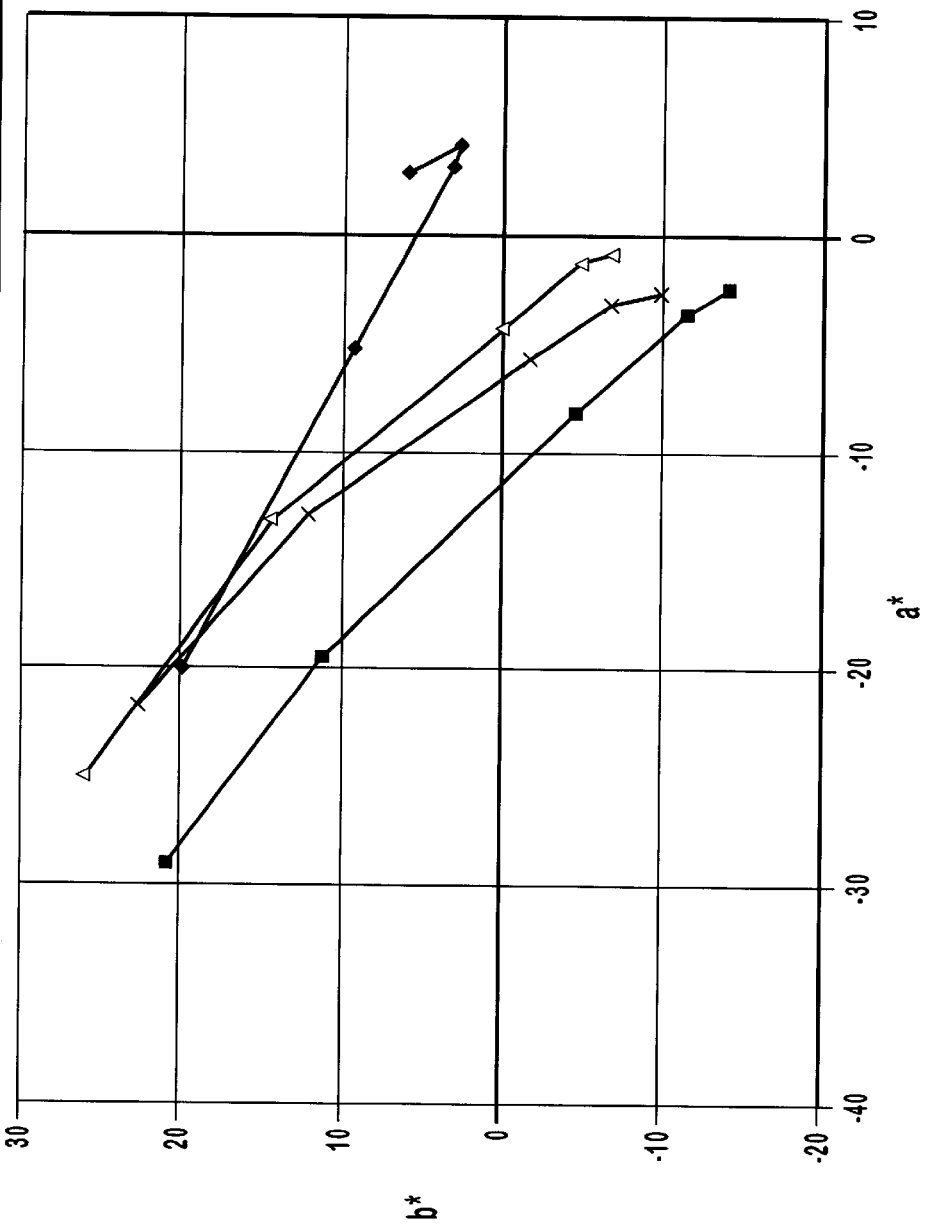
FIG. 15 is a plot in a*b* color space of color coordinates for the pigment Iriodin® 299 Flash Interference Green on two background materials upon Cr-coating according to the invention.

Sample: Control Iriodin ® Flash Interference Green in Example 6 on white background. Points (a*, b*) in this Table correspond to filled diamonds in FIG. 15.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 66.46 | 68.11 | 69.73 | 86.06 | 4.23 | 2.75 | 5.05 | 33.02 |
| 2 | 45 | 90 | 45 | 1 | 69.38 | 71.66 | 72.99 | 87.81 | 3.12 | 3.11 | 4.40 | 44.86 |
| 3 | 45 | 110 | 25 | 1 | 92.14 | 100.31 | 93.32 | 100.12 | −5.26 | 9.32 | 10.70 | 119.43 |
| 4 | 45 | 120 | 15 | 1 | 154.64 | 180.40 | 150.44 | 125.21 | −20.11 | 19.65 | 28.12 | 135.66 |
| 5 | 130 | 155 | −105 | 1 | 67.48 | 69.75 | 67.54 | 86.88 | 2.98 | 5.99 | 6.70 | 63.55 |

TABLE 27

Sample: Control Iriodin ® Flash Interference Green in Example 6 on black background. Points (a*, b*) in this Table correspond to squares in FIG. 15.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 6.45 | 7.17 | 11.38 | 32.18 | −3.53 | −11.59 | 12.11 | 253.06 |
| 2 | 45 | 90 | 45 | 1 | 10.59 | 12.35 | 15.21 | 41.76 | −8.15 | −4.69 | 9.40 | 209.90 |
| 3 | 45 | 110 | 25 | 1 | 37.53 | 46.25 | 39.58 | 73.71 | −19.55 | 11.24 | 22.55 | 150.10 |
| 4 | 45 | 120 | 15 | 1 | 87.38 | 109.71 | 85.80 | 103.64 | −29.10 | 20.66 | 35.69 | 144.63 |
| 5 | 130 | 155 | −105 | 1 | 5.46 | 5.98 | 10.53 | 29.35 | −2.40 | −14.04 | 14.24 | 260.28 |

TABLE 28

Sample: Cr-coated Iriodin ® Flash Interference Green in Example 6 on white background. Points (a*, b*) in this Table correspond to triangles in FIG. 15.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 8.36 | 8.97 | 11.32 | 35.94 | −1.29 | −4.95 | 5.12 | 255.42 |
| 2 | 45 | 90 | 45 | 1 | 12.86 | 14.25 | 15.29 | 44.60 | −4.26 | 0.03 | 4.26 | 179.57 |
| 3 | 45 | 110 | 25 | 1 | 41.41 | 48.42 | 38.96 | 75.09 | −13.26 | 14.38 | 19.56 | 132.67 |
| 4 | 45 | 120 | 15 | 1 | 112.72 | 136.54 | 101.05 | 112.69 | −25.01 | 25.86 | 35.98 | 134.04 |
| 5 | 130 | 155 | −105 | 1 | 6.79 | 7.24 | 9.85 | 32.35 | −0.80 | −6.84 | 6.89 | 263.36 |

TABLE 29

Sample: Cr-coated Iriodin ® Flash Interference Green in Example 6 on black background. Points (a*, b*) in this Table correspond to crosses in FIG. 15.

| N° | Illum | View | Diff. | Filt | X | Y | Z | L* | a* | b* | C* | h |
|---|---|---|---|---|---|---|---|---|---|---|---|---|
| 1 | 45 | 70 | 65 | 1 | 6.87 | 7.58 | 10.27 | 33.09 | −3.11 | −6.85 | 7.52 | 245.57 |
| 2 | 45 | 90 | 45 | 1 | 10.62 | 12.01 | 13.60 | 41.24 | −5.65 | −1.76 | 5.92 | 197.29 |
| 3 | 45 | 110 | 25 | 1 | 32.85 | 38.65 | 32.04 | 68.50 | −13.03 | 12.03 | 17.73 | 137.30 |
| 4 | 45 | 120 | 15 | 1 | 84.12 | 101.35 | 76.18 | 100.52 | −21.78 | 22.50 | 31.32 | 134.07 |
| 5 | 130 | 155 | −105 | 1 | 5.59 | 6.13 | 9.24 | 29.74 | −2.61 | −9.44 | 9.79 | 254.53 |

FIGS. 9–15 show the plots of the data given in Tables 2–29 for the respective pigments: Violet Pearl, Gold Pearl, Super Green Pearl, Super Red Mearlin Luster, Merck Iriodin® 221 Blue, Iriodin® 289 Flash Interference Blue, and Iriodin® 299 Flash Interference Green. The color characteristics are plotted in the a*b* space for the corresponding control sample on white and on black backgrounds and for the Cr-coated pigment according to this invention on white and on black backgrounds.

FIGS. 9–15 invariably show in all cases that the Cr-coated pigments according to this invention gave nearly the same color trajectory on both the white and black backgrounds whereas the control samples gave widely different color trajectories. This means that the Cr-coated pigments according to this invention will give paints a more constant color when painted over varying colored backgrounds. One of the practical consequences of this new attribute is that it allows a paint shop more freedom in repairs, especially when the paint is covering different colored bases.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming a thin coalescence film on a powdered substrate material, comprising the steps of:
   directing an inorganic powdered substrate material comprising a silicatic material precoated with a high refractive index dielectric material into a vacuum chamber containing a coating material vaporization source;
   generating a coating material vapor from the coating material vaporization source in a low temperature dry vacuum process;
   exposing the powdered substrate material to the coating material vapor in a substantially uniform manner; and
   forming a thin coalescence film of coating material on the powdered substrate material that substantially replicates a surface microstructure of the powdered substrate material, the coating material selected from the group consisting of oxides, sub-oxides, nitrides, borides, sulfides, carbides, carbon, and combinations thereof.

2. The method of claim 1, wherein the silicatic material is selected from the group consisting of mica, glass flakes, talc, and combinations thereof.

3. The method of claim 2, wherein the high refractive index dielectric material is selected from the group consisting of titanium dioxide, zirconium oxide, tin oxide, iron oxide, zinc oxide, tantalum pentoxide, magnesium oxide, tungsten trioxide, carbon, and combinations thereof.

4. The method of claim 1, wherein the powdered substrate material comprises a $TiO_2$-coated interference mica.

5. The method of claim 1, wherein the coating material vaporization source is selected from the group consisting of an evaporative source, a sputtering source, an electron beam deposition source, and an arc vapor deposition source.

6. The method of claim 1, wherein the dry vacuum process is carried out at a temperature of less than about 200° C.

7. The method of claim 1, wherein the dry vacuum process comprises a physical vapor deposition process.

8. The method of claim 1, wherein the coating material further comprises a metal.

9. The method of claim 1, wherein the coating material further comprises a metal selected from the group consisting of chromium, titanium, palladium, tin, aluminum, and combinations thereof.

10. The method claim 1, wherein the thin coalescence film has a thickness from about 30 Å to about 150 Å.

11. The method of claim 1, wherein the thin coalescence film has a thickness from about 30 Å to about 50 Å.

12. A coated powdered substrate material formed in accordance with the method of claim 1.

13. A method of forming a powdered pigment material, comprising the steps of:
   directing a powdered substrate material comprising a TiO2-coated interference mica into a vacuum chamber containing a coating material vaporization source;
   generating a coating material vapor comprising titanium from the coating material vaporization source in a dry vacuum process carried out at a temperature of less than about 200° C.;
   exposing the powdered substrate material to the coating material vapor in a substantially uniform manner; and
   depositing a thin coalescence film of coating material on the powdered substrate material to form a powdered pigment material, the thin coalescence film of coating material substantially replicating a surface microstructure of the powdered substrate material.

14. The method of claim 13, wherein the coating material vaporization source is selected from the group consisting of an evaporative source, a sputtering source, an electron beam deposition source, and an arc vapor deposition source.

15. The method of claim 13, wherein the dry vacuum process comprises a physical vapor deposition process.

16. The method of claim 13, wherein the thin coalescence film has a thickness from about 30 Å to about 150 Å.

17. The method of claim 13, wherein the pigment material has enhanced hiding powder relative to the hiding power of the substrate material.

18. The method of claim 13, wherein the pigment material has enhanced chroma relative to the chroma of the substrate material.

19. A powdered pigment material formed in accordance with the method of claim 13.

20. A powdered pigment material, comprising:
   a plurality of inorganic core flakes;
   a first coating layer of a high refractive index dielectric material substantially surrounding each of the core flakes and having an observable surface microstructure; and
   a second coating layer of a light absorbing material substantially surrounding the first coating layer, the second coating layer substantially replicating the surface microstructure of the first coating layer, the light absorbing material selected from the group consisting of oxides, sub-oxides, nitrides, borides, sulfides, carbides, carbon, and combinations thereof.

21. The pigment material of claim 20, wherein the core flakes comprise a silicatic material.

22. The pigment material of claim 21, wherein the silicatic material is selected from the group consisting of mica, glass flakes, talc, and combinations thereof.

23. The pigment material of claim 20, wherein the high refractive index dielectric material has an index of refraction of greater than about 1.65.

24. The pigment material of claim 22, wherein the high refractive index dielectric material of the first coating layer is selected from the group consisting of titanium dioxide, zirconium oxide, tin oxide, iron oxide, zinc oxide, tantalum pentoxide, magnesium oxide, tungsten trioxide, carbon, and combinations thereof.

25. The pigment material of claim 20, wherein the light absorbing material of the second coating layer further comprises a metal.

26. The pigment material of claim 20, wherein the light absorbing material of the second coating layer further comprises a metal selected from the group consisting of chromium, titanium, palladium, tin, aluminum, and combinations thereof.

27. The pigment material of claim 20, wherein the second coating layer has a thickness from about 30 Å to about 150 Å.

28. The pigment material of claim 20, wherein the second coating layer has a thickness from about 30 Å to about 50 Å.

29. A coating apparatus for depositing a thin coalescence film on a powdered substrate material, comprising:
   a vacuum chamber;
   a coating material vaporization source disposed within the vacuum chamber; and
   a vibrating bed capable of holding a powdered substrate material and exposing the substrate material in a substantially uniform manner to coating material vapor produced by the vaporization source, the vibrating bed including a rotatable container for holding the powdered substrate material, and a vibrator that is operatively connected to the container for producing a substantially helical motion of the substrate material in the container.

30. The coating apparatus of claim 29, wherein the coating material vaporization source is selected from the group consisting of an evaporative source, a sputtering source, an electron beam deposition source, and an arc vapor deposition source.

31. The apparatus of claim 30, wherein the sputtering source is selected from the group consisting of sputter magnetrons, hollow cathode sputtering systems, triode sputtering systems, RF sputtering systems, ion beam sputtering sources, and reactive sputtering sources.

32. The apparatus of claim 30, wherein the arc vapor deposition source is selected from the group consisting of a cathodic arc vapor deposition source and an anodic arc vapor deposition source.

33. The coating apparatus of claim 29, wherein the vibrator comprises a vacuum sealed electromagnet.

34. The coating apparatus of claim 29, wherein the vibrating bed further comprises a base composed of a magnetic material that is attached to the container, and a flat spring attached to the base.

35. A coating apparatus for depositing a thin coalescence film on a powdered substrate material, comprising:
   a vacuum chamber;
   a coating material vaporization source disposed within the vacuum chamber; and
   a vibrating conveyor coater capable of circulating a powdered substrate material and exposing the substrate material in a substantially uniform manner to coating material vapor produced by the vaporization source, the vibrating conveyer coater including a plurality of conveyors that are overlapping arranged in a closed pattern so that the powdered substrate material effectively moves from one conveyor to an adjacent conveyer.

36. The coating apparatus of claim 35, wherein the coating material vaporization source is selected from the group consisting of an evaporative source, a sputtering source, an electron beam deposition source, and an arc vapor deposition source.

37. The coating apparatus of claim 35, wherein the vibrating conveyor coater includes four conveyors that are overlappingly arranged in a rectangular pattern.

38. The coating apparatus of claim 37, wherein the coating material vaporization source is disposed above one of the conveyors.

39. The coating apparatus of claim 37, wherein the conveyors each include a tray for holding the powdered substrate material, and a vibrating device disposed beneath the tray and operatively connected to the tray.

40. The coating apparatus of claim 39, wherein each tray is longitudinally tilted with respect to a horizontal plane such that an upper end of one tray overlaps a lower end of an adjacent tray.

41. The coating apparatus of claim 40, wherein each tray is tilted at an angle from about 1° to about 20°.

42. The coating apparatus of claim 35, wherein the vibrating conveyor coater is an electromagnetic device.

43. The coating apparatus of claim 35, wherein the vibrating conveyor coater is a pulsating gas-driven device.

44. A coating apparatus for depositing a thin coalescence film on a powdered substrate material, comprising:
   a vacuum chamber defined by an elongated coating tower structure;
   a plurality of coating material vaporization sources in communication with the vacuum chamber;
   means for supplying a powdered substrate material to the vacuum chamber to produce a coated substrate material;
   a ledged tray device disposed alone the length of the tower structure on an opposing side from the vaporization sources, the ledged tray device configured such that the powdered substrate material runs downward thereover and through the vacuum chamber; and
   means for collecting the coated substrate material.

45. The coating apparatus of claim 44, wherein the tower structure is positioned in a substantially vertical manner such that the powdered substrate material free-falls through the vacuum chamber.

46. The coating apparatus of claim 44, wherein the coating material vaporization sources are selected from the group consisting of evaporative sources, sputtering sources, electron beam deposition sources, and arc vapor deposition sources.

47. The coating apparatus of claim 44, wherein the coating material vaporization sources are disposed around the perimeter and along the length of the tower structure.

48. The coating apparatus of claim 47, wherein the tower structure has a transverse cross-sectional shape that is rectangular.

49. The coating apparatus of claim 47, wherein the tower structure has a transverse cross-sectional shape that is hexagonal.

50. The coating apparatus of claim 44, wherein the means for supplying a powdered substrate material comprises a feeding mechanism selected from the group consisting of a container coupled to a percussion device, a container coupled to a vibrator, and combinations thereof.

51. The coating apparatus of claim 46, wherein the tower structure is tilted with respect to a vertical position.

52. The coating apparatus of claim 51, wherein the tower structure is tilted at an angle of about 1° to about 20° with respect to a vertical position.

53. The coating apparatus of claim 51, wherein the coating material vaporization sources are disposed along the length and on one side of the tower structure.

54. The coating apparatus of claim 44, wherein the ledged tray device includes longitudinally extending lateral flanges that confine the powdered substrate material which runs downward through the vacuum chamber.

55. A coating apparatus for depositing a thin coalescence film on a powdered substrate material, comprising:

a vacuum chamber defined by an elongated coating tower structure that is tilted with respect to a vertical position;

a plurality of coating material vaporization sources in communication with the vacuum chamber;

means for supplying a powdered substrate material to the vacuum chamber to produce a coated substrate material;

a ledged tray device disposed along the length of the tower structure on an opposing side from the vaporization sources, the ledged tray device configured such that the powdered substrate material runs downward thereover and through the vacuum chamber; and means for collecting the coated substrate material.

56. The coating apparatus of claim 55, wherein the tower structure is tilted at an angle of about 1° to 20° with respect to a vertical position.

57. The coating apparatus of claim 55, wherein the coating material vaporization sources are disposed along the length and on one side of the tower structure.

58. The coating apparatus of claim 55, wherein the ledged tray device includes longitudinally extending lateral flanges that confine the powdered substrate material which runs downward through the vacuum chamber.

59. A powdered pigment material, comprising:

a plurality of inorganic core flakes;

a first coating layer of a high refractive index dielectric material substantially surrounding each of the core flakes and having an observable surface microstructure; and a second coating layer of a light absorbing material comprising titanium and substantially surrounding the first coating layer, the second coating layer substantially replicating the surface microstructure of the first coating layer.

60. The pigment material of claim 59, wherein the core flakes comprise a silicatic material.

61. The pigment material of claim 60, wherein the silicatic material is selected from the group consisting of mica, glass flakes, talc, and combinations thereof.

62. The pigment material of claim 59, wherein the high refractive index dielectric material has an index of refraction of greater than about 1.65.

63. The pigment material of claim 62, wherein the high refractive index dielectric material is selected from the group consisting of titanium dioxide, zirconium oxide, tin oxide, iron oxide, zinc oxide, tantalum pentoxide, magnesium oxide, tungsten trioxide, carbon, and combinations thereof.

* * * * *

UNITED STATES PATENT AND TRADEMARK OFFICE
CERTIFICATE OF CORRECTION

PATENT NO. : 6,241,858 B1
DATED : June 5, 2001
INVENTOR(S) : Roger W. Phillips and Vladimir Raksha It is certified that error appears in the above-identified patent and that said Letters Patent is hereby corrected as shown below:

Title page,
U.S. PATENT DOCUMENTS, change "Tumer" to -- Turner --

Column 6,
Line 20, change "TiO2-coated" to -- $TiO_2$-coated --

Column 9,
Line 6, change "waterfall -equipped" ' to -- waterfall-equipped --
Line 24, change "diamond like" to -- diamond-like --

Column 10,
Line 60, delete [when]

Column 11,
Line 36, after "drum" change "233is" to -- 233 is --

Column 16,
Line 42, change "colors;" to -- colors, --
Line 43, after "brightness" insert -- , --
Line 57, before "deepening" change "signify" to -- signifying --

Column 17,
Line 7, after "symbol" change "$\alpha$" to -- $\Delta$ --

Column 18,
Line 49, after "example" insert -- , --

UNITED STATES PATENT AND TRADEMARK OFFICE
CERTIFICATE OF CORRECTION

PATENT NO. : 6,241,858 B1
DATED : June 5, 2001
INVENTOR(S) : Roger W. Phillips and Vladimir Raksha It is certified that error appears in the above-identified patent and that said Letters Patent is hereby corrected as shown below:

<u>Column 31,</u>
Table 21, Line 1, change "8 31" to -- 8.31 --
Table 23, Description: after "correspond" change "lo" to -- to --

Signed and Sealed this

Twenty-first Day of May, 2002

Attest:

Attesting Officer

JAMES E. ROGAN
Director of the United States Patent and Trademark Office